United States Patent
Roh et al.

(10) Patent No.: US 12,414,297 B2
(45) Date of Patent: Sep. 9, 2025

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Junghyun Roh, Asan-si (KR); Seungweon Ha, Cheonan-si (KR); Jaeyoung Hong, Hwaseong-si (KR); Wangsun Lim, Chungcheongnam-do (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 476 days.

(21) Appl. No.: 17/806,902

(22) Filed: Jun. 14, 2022

(65) Prior Publication Data

US 2023/0117682 A1    Apr. 20, 2023

(30) Foreign Application Priority Data

Oct. 14, 2021  (KR) .................. 10-2021-0136967

(51) Int. Cl.
*H10B 43/27*    (2023.01)
*H10B 41/10*    (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 43/27; H10B 41/10; H10B 41/27; H10B 41/35; H10B 41/40; H10B 43/10;
(Continued)

(56) References Cited

U.S. PATENT DOCUMENTS 6,594,818 B2    7/2003  Kim et al.
7,777,341 B2    8/2010  Kumagai
(Continued)

FOREIGN PATENT DOCUMENTS

KR    10-2017-0061247 A    6/2017
KR    10-2021-0030714      3/2021
KR    10-2021-0032271 A    3/2021

OTHER PUBLICATIONS

Office Action dated May 31, 2025 issued in corresponding Korean Patent Application No. 10-2021-0136967.

*Primary Examiner* — Shahed Ahmed
(74) *Attorney, Agent, or Firm* — Morgan, Lewis & Bockius LLP

(57) ABSTRACT

A semiconductor device includes a substrate that includes a cell array region, a peripheral region, and a scribe lane region. A stack structure is disposed on the cell array region of the substrate and includes electrodes that are vertically stacked and spaced apart from each other. A dummy structure extends from the peripheral region to the scribe lane region of the substrate and includes first dielectric layers and second dielectric layers that are alternately and repeatedly stacked. A vertical channel structure penetrates the stack structure, and a slit in the dummy structure on the scribe lane region. The slit extends in a direction that is perpendicular to a top surface of the substrate and penetrates at least a portion of the dummy structure. The slit includes a void.

20 Claims, 30 Drawing Sheets

(51) Int. Cl.
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC ............ *H10B 41/40* (2023.02); *H10B 43/10* (2023.02); *H10B 43/35* (2023.02); *H10B 43/40* (2023.02)

(58) Field of Classification Search
CPC ........ H10B 43/35; H10B 43/40; H10B 43/50; H10B 43/00–50; G11C 16/0466–0475; G11C 27/005; G11C 11/5671; H01L 29/0649–0653
See application file for complete search history.

(56) References Cited

U.S. PATENT DOCUMENTS

| | | |
|---|---|---|
| 9,589,981 B2 | 3/2017 | Nishikawa et al. |
| 9,634,016 B2 | 4/2017 | Kim et al. |
| 10,381,373 B2 | 8/2019 | Okizumi et al. |
| 10,763,222 B2 | 9/2020 | Jeong et al. |
| 2017/0162592 A1* | 6/2017 | Nishikawa .......... H01L 23/5226 |
| 2021/0050446 A1 | 2/2021 | Sun et al. |
| 2021/0217767 A1* | 7/2021 | Lai ..................... H10B 43/27 |
| 2021/0313246 A1* | 10/2021 | Matsumura ............ H10B 43/40 |
| 2022/0173040 A1* | 6/2022 | Wang ................ H01L 21/76895 |

\* cited by examiner

SEMICONDUCTOR DEVICE AND ELECTRONIC SYSTEM INCLUDING THE SAME

CROSS-REFERENCE TO RELATED APPLICATION

This U.S. nonprovisional patent application claims priority under 35 U.S.C. § 119 to Korean Patent Application No. 10-2021-0136967, filed on Oct. 14, 2021 in the Korean Intellectual Property Office, the disclosure of which is hereby incorporated by reference in its entirety.

TECHNICAL FIELD

The present inventive concepts relate to semiconductors and, more particularly, to a semiconductor device and an electronic system including the same.

DISCUSSION OF THE RELATED ART

Semiconductor devices capable of storing ever larger amounts of data are being developed. One example of an approach for increasing data storage capacity of a semiconductor device is to include three-dimensionally arranged memory cells, for example, including multiple different levels of memory cells stacked one on top of the other within a single chip package, instead of two-dimensionally arranged memory cells in which memory cells are only arranged side-by-side.

SUMMARY

A semiconductor device includes a substrate that includes a cell array region, a peripheral region, and a scribe lane region. A stack structure is disposed on the cell array region of the substrate. The stack structure includes a plurality of electrodes that are vertically stacked and spaced apart from each other. A dummy structure extends from the peripheral region to the scribe lane region of the substrate. The dummy structure includes a plurality of first dielectric layers and a plurality of second dielectric layers that are alternately and repeatedly stacked. A vertical channel structure penetrates the stack structure. A slit is disposed in the dummy structure on the scribe lane region. The slit extends in a direction perpendicular to a top surface of the substrate and penetrates at least a portion of the dummy structure. The slit includes a void.

A semiconductor device includes a substrate that includes a cell array region, a peripheral region, and a scribe lane region. A stack structure is disposed on the cell array region of the substrate. The stack structure includes a plurality of electrodes that are vertically stacked and spaced apart from each other. A dummy structure extends from the peripheral region to the scribe lane region of the substrate. The dummy structure includes a plurality of first dielectric layers and a plurality of second dielectric layers that are alternately and repeatedly stacked. A vertical channel structure penetrates the stack structure. A slit is disposed in the dummy structure on the scribe lane region. The slit extends in a direction perpendicular to a top surface of the substrate and penetrates at least a portion of the dummy structure. The slit includes a slit layer that at least partially covers a top surface of the slit.

An electronic system includes a three-dimensional semiconductor memory device. A controller is electrically connected to the three-dimensional semiconductor memory device and the controller is configured to control the three-dimensional semiconductor memory device. The three-dimensional semiconductor memory device includes a substrate that includes a cell array region, a peripheral region, and a scribe lane region. A stack structure is disposed on the cell array region of the substrate. The stack structure includes a plurality of electrodes that are vertically stacked and spaced apart from each other. A dummy structure extends from the peripheral region to the scribe lane region of the substrate. The dummy structure includes a plurality of first dielectric layers and a plurality of second dielectric layers that are alternately and repeatedly stacked. A vertical channel structure penetrates the stack structure. A slit is disposed in the dummy structure on the scribe lane region. The slit extends in a direction perpendicular to a top surface of the substrate and penetrates at least a portion of the dummy structure. The slit includes a void.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAIL PARTED DESCRIPTION OF EMBODIMENTS

Figure 1:
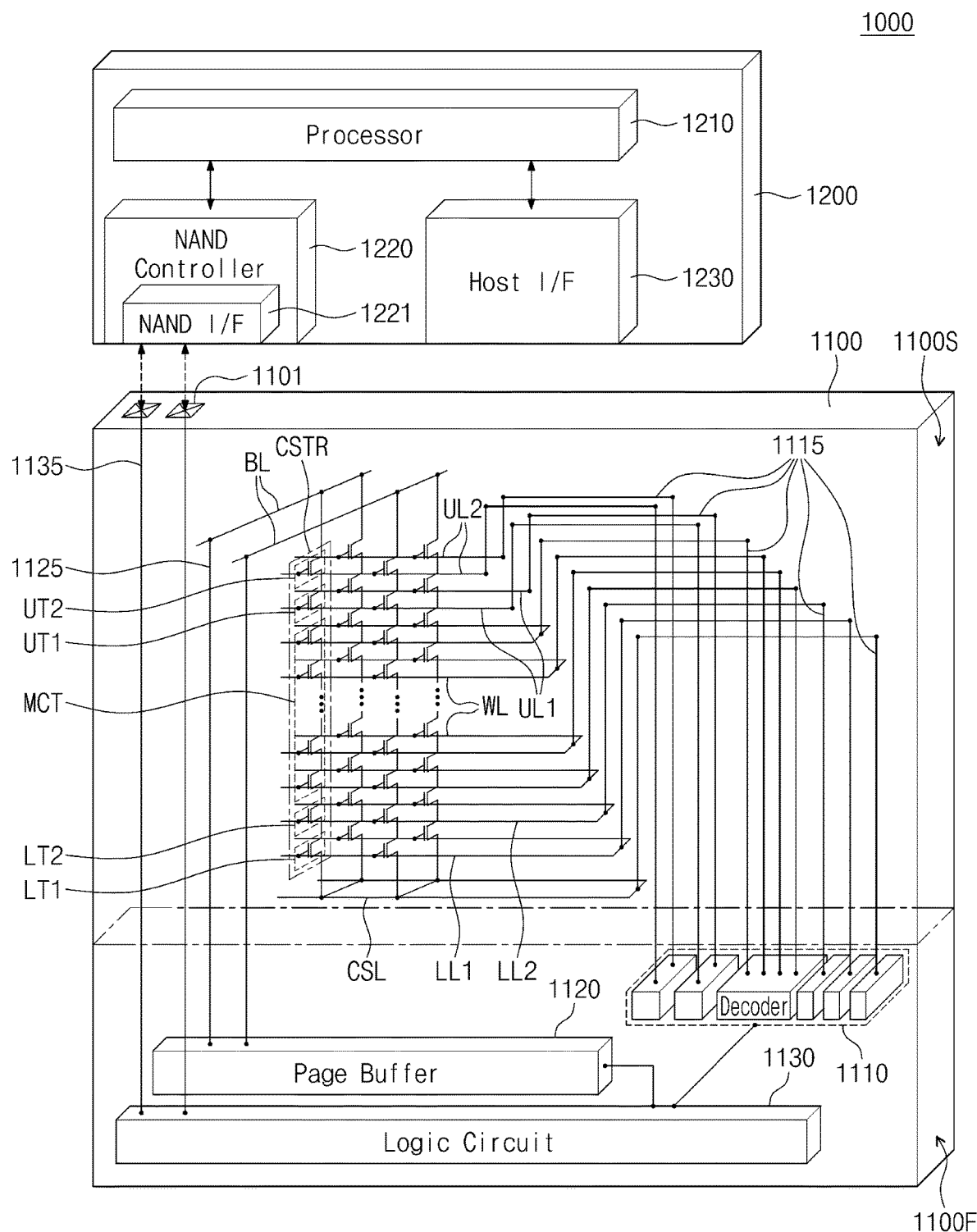
FIG. 1 is a simplified schematic diagram showing an electronic system including a semiconductor device according to some embodiments of the present inventive concepts.

FIG. 1 is a simplified schematic diagram showing an electronic system including a semiconductor device according to some embodiments of the present inventive concepts.

Referring to FIG. 1, an electronic system 1000, according to some embodiments of the present inventive concepts, may include a semiconductor device 1100 and a controller 1200 electrically connected to the semiconductor device 1100. The electronic system 1000 may be a storage device that includes a single or a plurality of semiconductor devices 1100 or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S disposed on the first structure 1100F. In some embodiments, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR disposed between the bit line BL and the common source line CSL.

For the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and the number of the upper transistors UT1 and UT2 may be variously changed in accordance with different embodiments.

In some embodiments, the upper transistors UT1 and UT2 may include a string selection transistor and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

For the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control each of the plurality of semiconductor devices 1100.

The processor 1210 may control an overall operation of the electronic system 1000 that includes the controller 1200. The processor 1210 may operate based on firmware, and may control the NAND controller 1220 to access the semiconductor device 1100. The NAND controller 1220 may include a NAND interface 1221 that processes communication with the semiconductor device 1100. The NAND interface 1221 may be used to provide a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
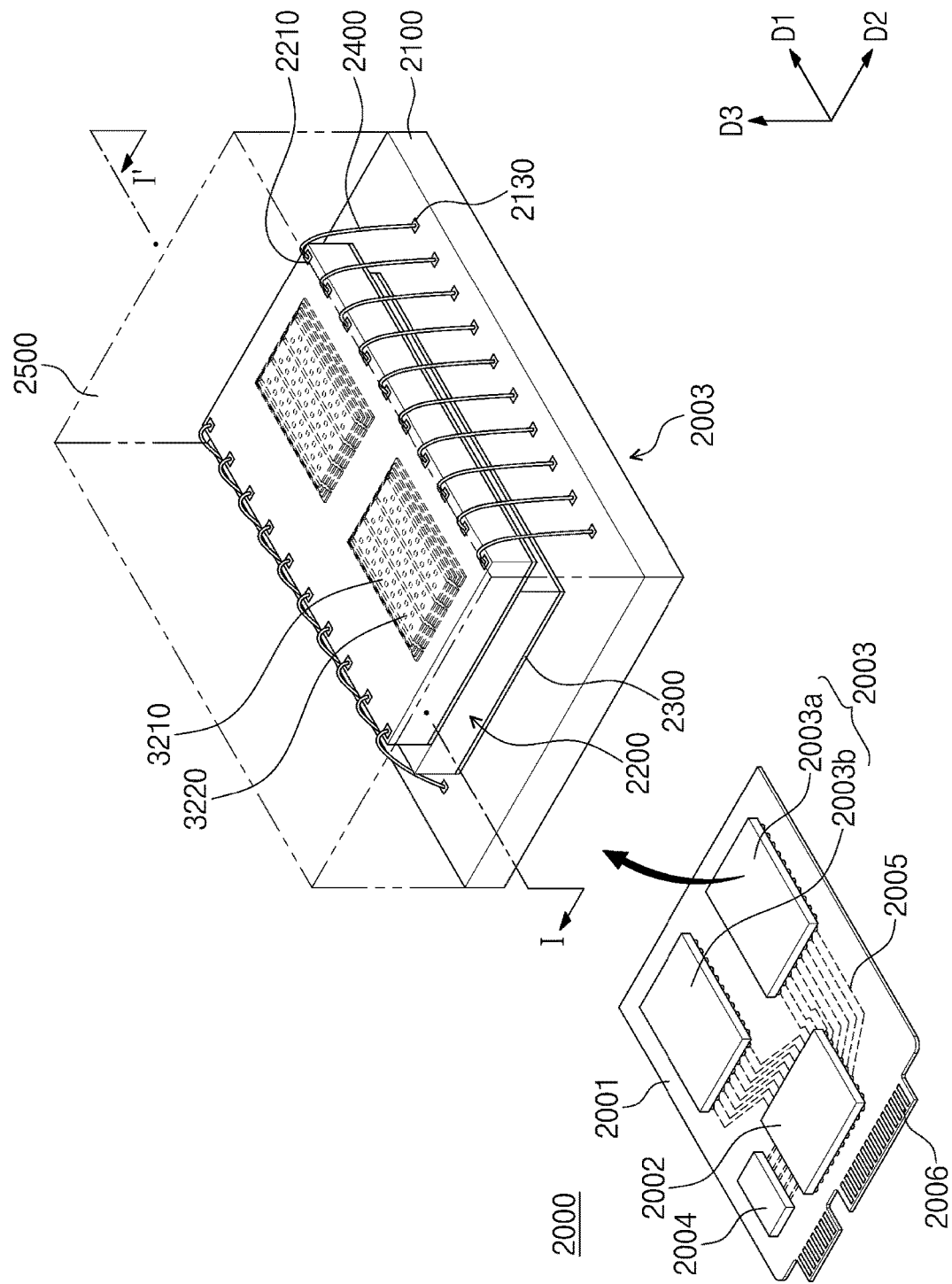
FIG. 2 is a simplified perspective view showing an electronic system including a semiconductor device according to some embodiments of the present inventive concepts.

FIG. 2 is a simplified perspective view showing an electronic system including a semiconductor device according to some embodiments of the present inventive concepts.

Referring to FIG. 2, an electronic system 2000, according to some example embodiments of the present inventive concepts, may include a main board 2001, a controller 2002 mounted on the main board 2001, one or more semiconductor packages 2003 mounted on the main board 2001, and a dynamic random access memory (DRAM) 2004 mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are provided to connect with an external host. The number and arrangement of the plurality of pins on the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space.

The DRAM 2004 included in the electronic system 2000 may operate as a cache memory and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 disposed on the package substrate 2100, adhesion layers 2300 correspondingly disposed on bottom surfaces of the semiconductor chips 2200, connection structures 2400 that electrically connect the semiconductor chips 2200 to the package substrate 2100, and a molding layer 2500 disposed on the package substrate 2100 and at least partially covering the semiconductor chips 2200 and the connection structures 2400.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 1. Each of the semiconductor chips 2200 may include stack structures 3210 and vertical structures 3220. Each of the semiconductor chips 2200 may include a semiconductor device according to some embodiments of the present inventive concepts which will be discussed below.

In some embodiments, the connection structures 2400 may include bonding wires that electrically connect the input/output pads 2210 to the package upper pads 2130. Therefore, on each of the first and second semiconductor packages 2003a and 2003b, the semiconductor chips 2200 may be electrically connected to each other in a wire bonding manner and may be electrically connected to the package upper pads 2130 of the package substrate 2100. In some embodiments, on each of the first and second semiconductor packages 2003a and 2003b, the semiconductor chips 2200 may be electrically connected to each other using through-silicon vias (TSVs) instead of the connection structures 2400 or the bonding wires.

In some embodiments, the controller 2002 and the semiconductor chips 2200 may be included within a single package. For example, the controller 2002 and the semiconductor chips 2200 may be mounted on an interposer substrate other than the main board 2001 and may be connected to each other through wiring lines formed on the interposer substrate.

Figure 3:
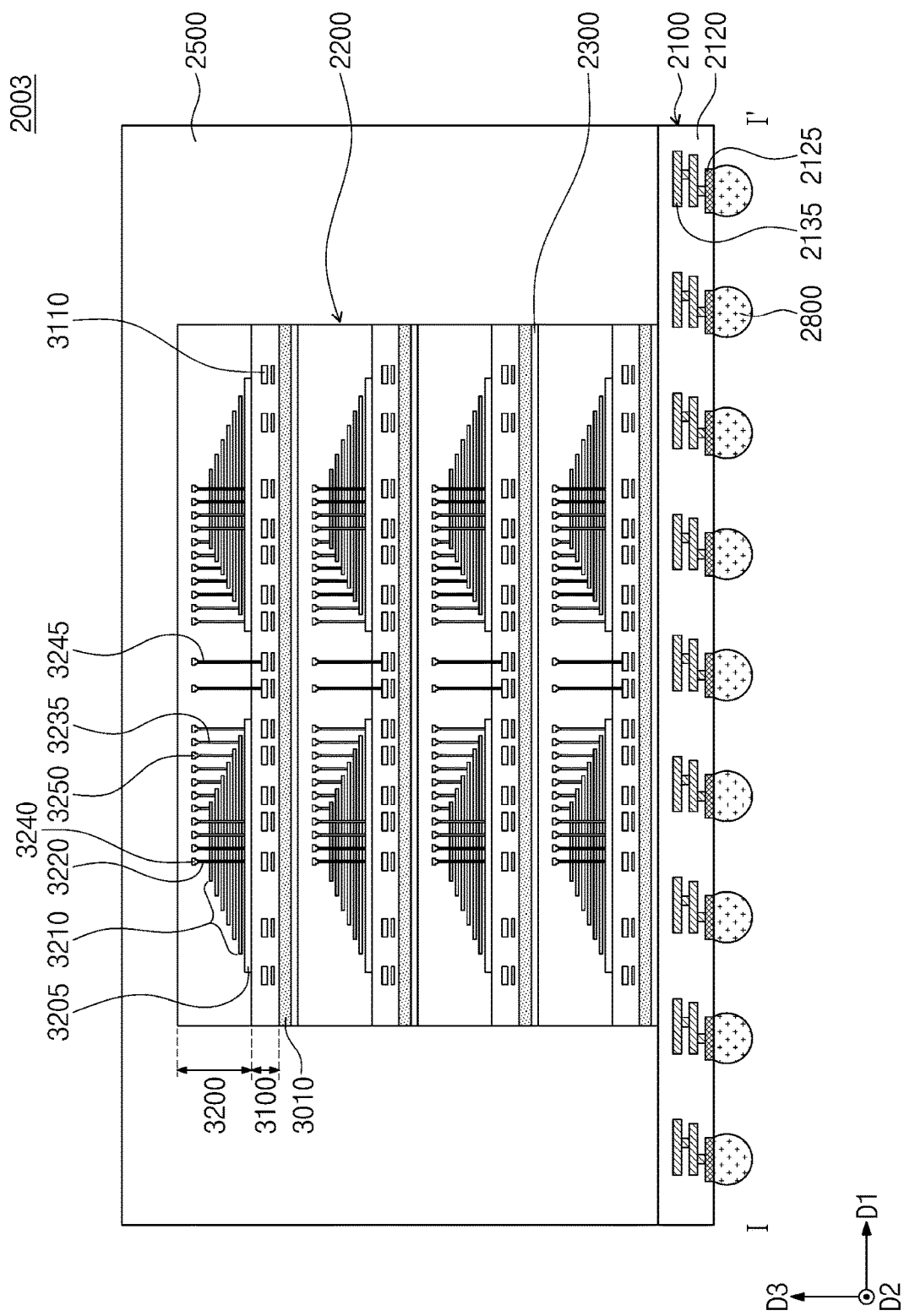
FIGS. 3 and 4 are simplified cross-sectional views showing a semiconductor package according to some embodiments of the present inventive concepts.
Figure 4:
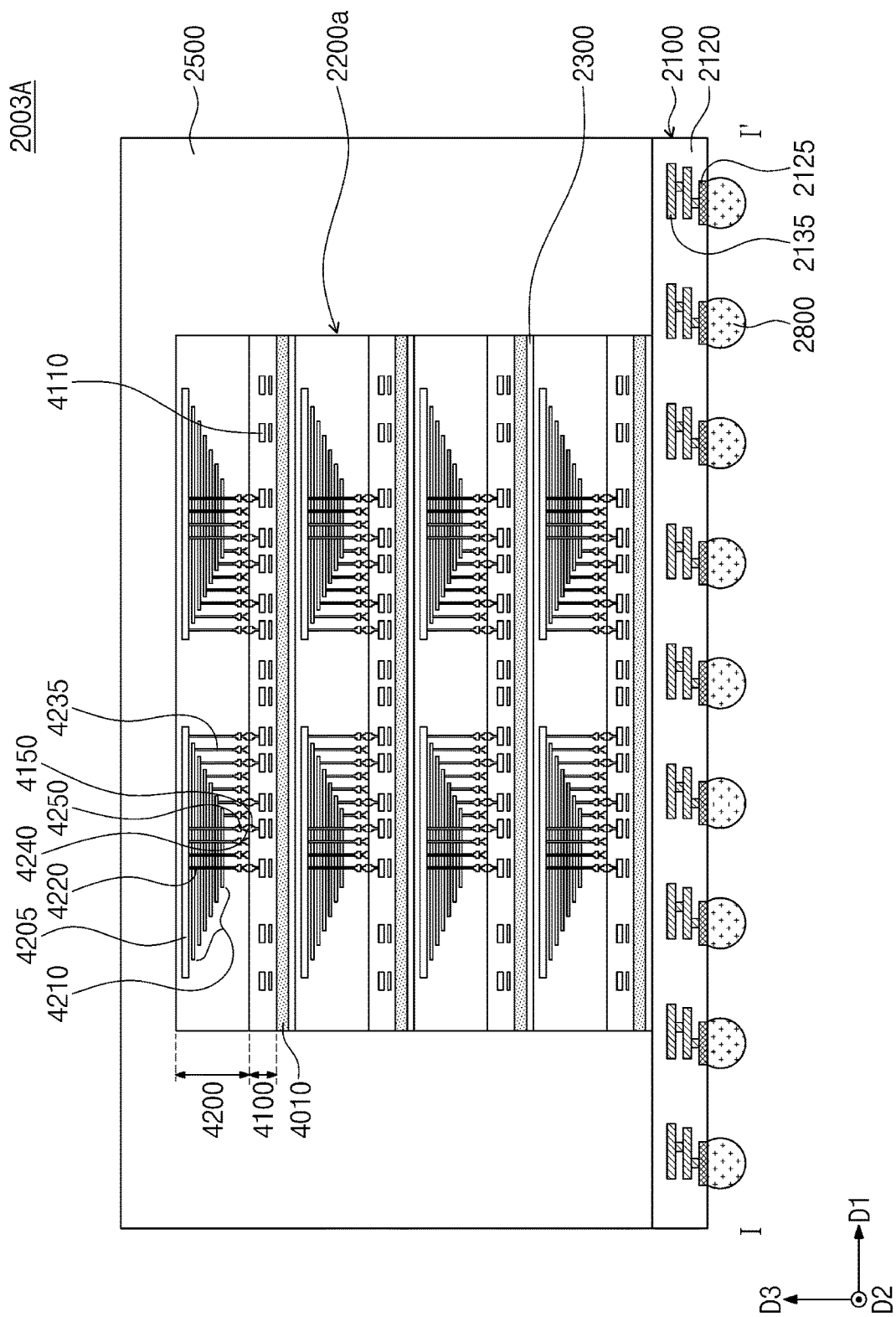

FIGS. 3 and 4 are simplified cross-sectional views showing a semiconductor package according to some embodiments of the present inventive concepts. FIGS. 3 and 4 depict examples of a semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, package upper pads (see 2130 of FIG. 2) disposed on a top surface of the package substrate body 2120, package lower pads 2125 disposed and/or exposed on a bottom surface of the package substrate body 2120, and internal lines 2135 in the package substrate body 2120 and electrically connecting the package upper pads 2130 to the package lower pads 2125. The package upper pads 2130 may be electrically connected to the connection structures 2400. The package lower pads 2125 may be connected through conductive connectors 2800 to the wiring patterns 2005 of the main board 2001 in the electronic system 2000, as shown in FIG. 2.

Each of the semiconductor chips 2200 may include a semiconductor substrate 3010 and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 and separation structures that penetrate the stack structure 3210, bit lines 3240 electrically connected to the vertical structures 3220, and cell contact plugs 3235 electrically connected to the word lines (see WL of FIG. 1) of the stack structure 3210. Each of the first structure 3100, the second structure 3200, and the semiconductor chips 2200 may further include separation structures which will be discussed below.

Each of the semiconductor chips 2200 may include one or more through lines 3245 that electrically connect with the peripheral wiring lines 3110 of the first structure 3100 and extend into the second structure 3200. The through line 3245 may be disposed outside of the stack structure 3210 and may further penetrate the stack structure 3210. Each of the semiconductor chips 2200 may further include one or more input/output pads (see 2210 of FIG. 2) electrically connected to the peripheral wiring lines 3110 of the first structure 3100.

Referring to FIG. 4, a semiconductor package 2003A may be configured such that each of semiconductor chips 2200a may include a semiconductor substrate 4010, a first structure 4100 disposed on the semiconductor substrate 4010, and a second structure 4200 disposed on the first structure 4100 and coupled to the first structure 4100 in a wafer bonding manner.

The first structure 4100 may include a peripheral circuit region including peripheral wiring lines 4110 and first bonding structures 4150. The second structure 4200 may include a source structure 4205, a stack structure 4210 disposed between the source structure 4205 and the first structure 4100, vertical structures 4220 and separation structures that penetrate the stack structure 4210, and second bonding structures 4250 correspondingly electrically connected to the vertical structures 4220 and the word lines (see WL of FIG. 1) of the stack structure 4210. For example, the second bonding structures 4250 may be electrically connected to the vertical structures 4220 and the word lines (see WL of FIG. 1) through bit lines 4240 electrically connected to the vertical structures 4220 and through cell contact plugs 4235 electrically connected to the word lines (see WL of FIG. 1). The first bonding structures 4150 of the first structure 4100 and the second bonding structures 4250 of the second structure 4200 may be coupled to each other while being in contact with each other. The first and second bonding structures 4150 and 4250 may have their bonding portions formed of, for example, copper (Cu).

Each of the first structure 4100, the second structure 4200, and the semiconductor chip 2200a may further include a source structure which will be discussed below. Each of the semiconductor chips 2200a may further include one or more input/output pads (see 2210 of FIG. 2) electrically connected to the peripheral wiring lines 4110.

The semiconductor chips 2200 of FIG. 3 may be electrically connected to each other through the connection structures 2400 shaped like bonding wires, and this may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes such as TSV (through silicon via).

The first structure 3100 of FIG. 3 and the first structure 4100 of FIG. 4 may each correspond to a peripheral circuit structure in the following described embodiments, and the second structure 3200 of FIG. 3 and the second structure 4200 of FIG. 4 may each correspond to a cell array structure in the following described embodiments.

Figure 5:
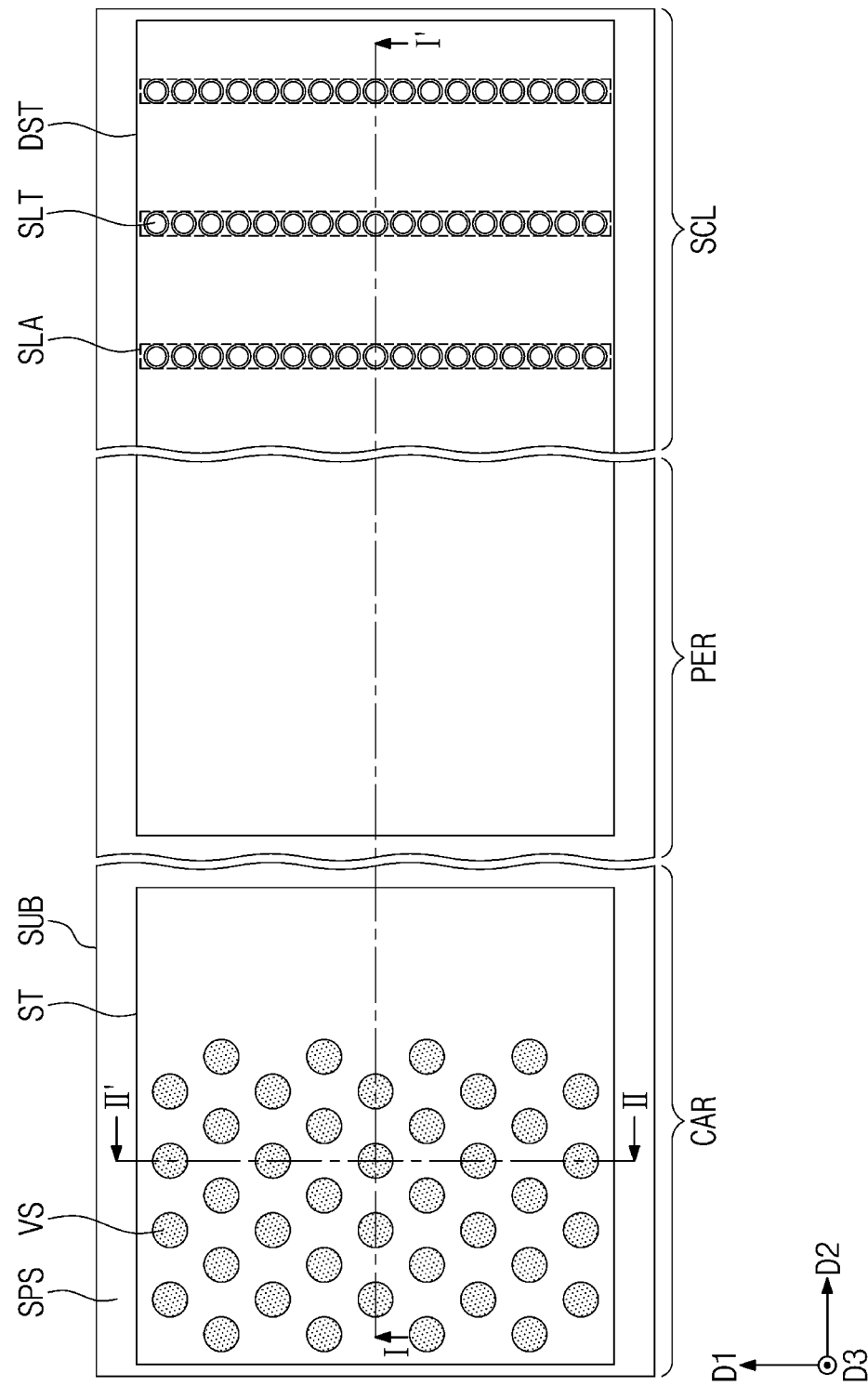
FIG. 5 is a plan view showing a semiconductor device according to some embodiments of the present inventive concepts.
Figure 6A:
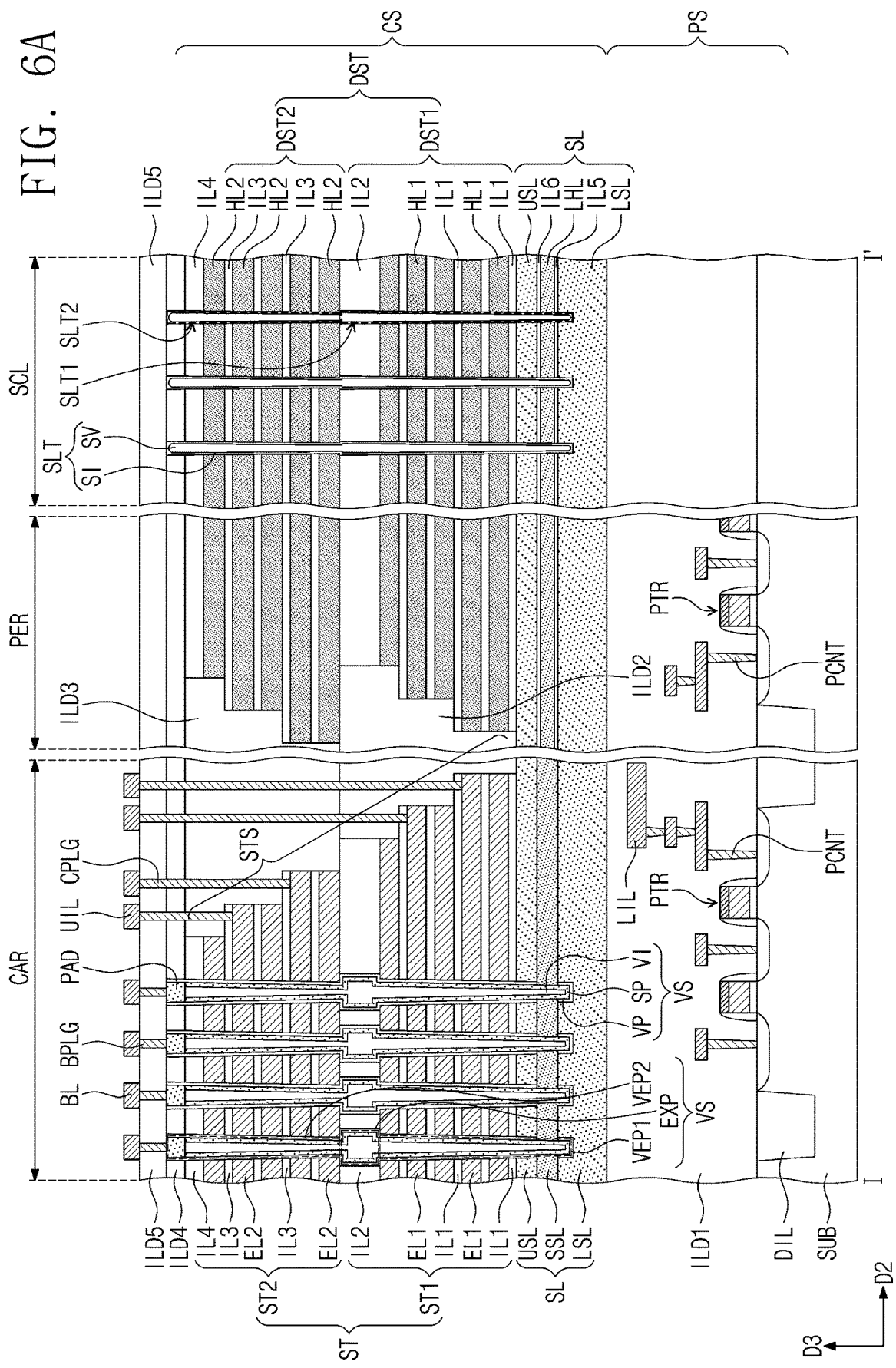
FIG. 6A is a cross-sectional view taken along line I-I' of FIG. 5.
Figure 6B:
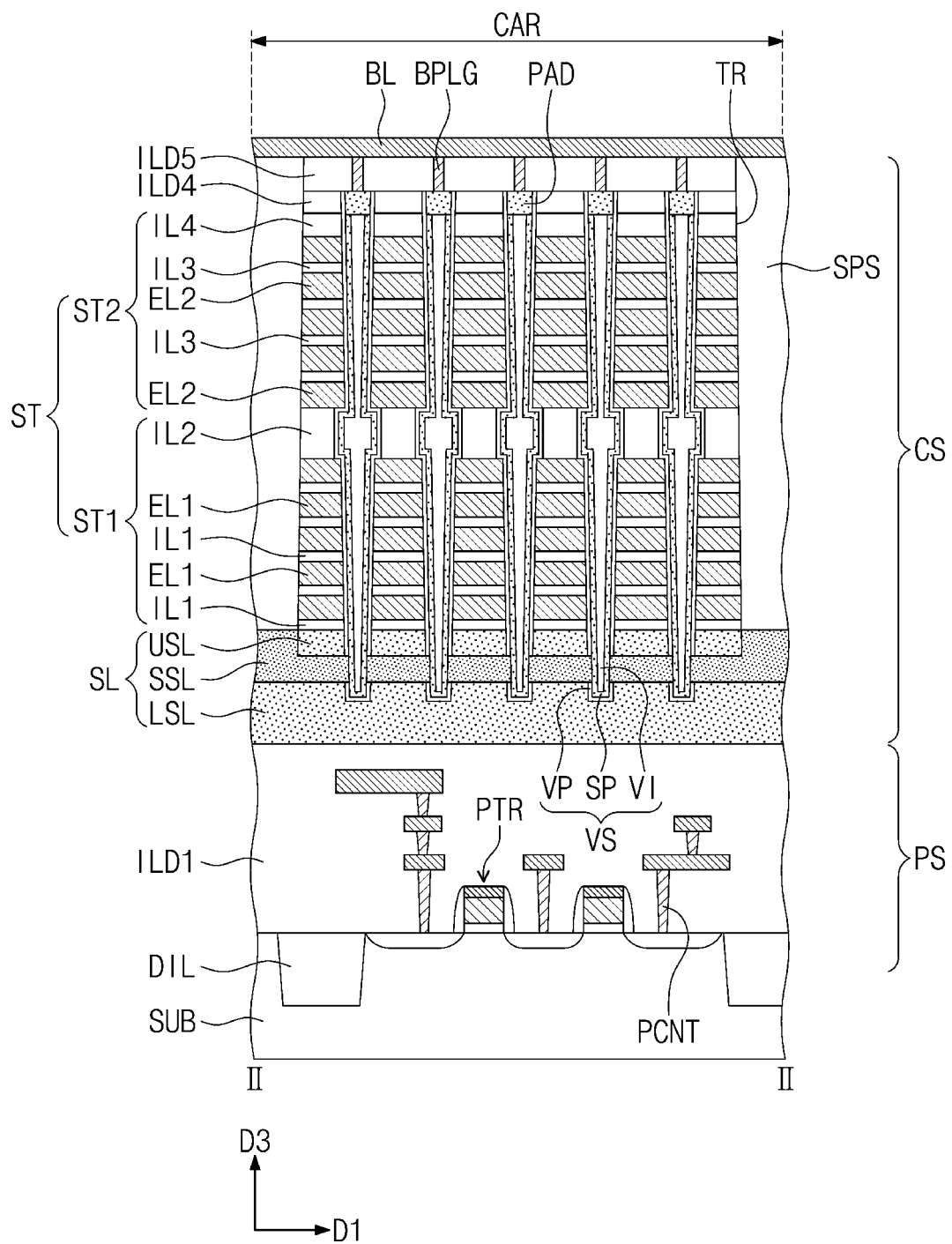
FIG. 6B is a cross-sectional view taken along line II-II' of FIG. 5.

FIG. 5 is a plan view showing a semiconductor device according to some embodiments of the present inventive concepts. FIG. 6A is a cross-sectional view taken along line I-I' of FIG. 5. FIG. 6B is a cross-sectional view taken along line II-II' of FIG. 5.

Referring to FIGS. 5, 6A, and 6B, a first substrate SUB may be provided with a peripheral circuit structure PS that includes peripheral transistors PTR. The peripheral circuit structure PS may be provided with a cell array structure CS that includes a stack structure ST. The first substrate SUB may be a silicon substrate, a silicon-germanium substrate, a germanium substrate, or a single crystalline epitaxial layer grown on a single-crystalline silicon substrate. The first substrate SUB may include active regions defined by a device isolation layer DIL.

The peripheral circuit structure PS may include a plurality of peripheral transistors PTR disposed on the active regions of the first substrate SUB. The peripheral transistors PTR may include row and column decoders, a page buffer, a control circuit, and/or a peripheral logic circuit.

The peripheral circuit structure PS may include a peripheral circuit including a decoder circuit, a page buffer, and a logic circuit. For example, the peripheral circuit structure PS may further include lower wiring lines LIL that are provided on the peripheral transistors PTR and a first interlayer dielectric layer ILD1 that at least partially covers the peripheral transistors PTR and the lower wiring lines LIL. A peripheral contact PCNT may be provided between and electrically connect to the lower wiring line LIL and the peripheral transistor PTR. The first interlayer dielectric layer ILD1 may include a plurality of stacked dielectric layers. For example, the first interlayer dielectric layer ILD1 may include a silicon oxide layer, a silicon nitride layer, a silicon oxynitride layer, and/or a low-k dielectric layer (where the low-k dielectric layer is a layer having a dielectric constant that is lower than that of silicon dioxide). The cell array structure CS may be provided on the first interlayer dielectric layer ILD1 of the peripheral circuit structure PS. The following will describe in detail the cell array structure CS.

A second substrate SL may be provided on the first interlayer dielectric layer ILD1. The second substrate SL may include a cell array region CAR, a peripheral region PER, and a scribe lane region SCL. The peripheral region PER may be positioned between the cell array region CAR and the scribe lane region SCL. The peripheral region PER may be an outer area of a semiconductor chip. The scribe lane region SCL may partially remain on the outer area of the semiconductor chip.

The second substrate SL may include a stack structure ST provided on the cell array region CAR, and a dummy structure DST provided on the peripheral region PER and the scribe lane region SCL.

On the cell array region CAR, the second substrate SL may include a lower semiconductor layer LSL, a source semiconductor layer SSL, and an upper semiconductor layer USL that are sequentially stacked. Each of the lower semiconductor layer LSL, the source semiconductor layer SSL, and the upper semiconductor layer USL may include a semiconductor material, such as silicon (Si), germanium (Ge), silicon-germanium (SiGe), gallium-arsenic (GaAs), indium-gallium-arsenic (InGaAs), aluminum-gallium-arsenic (AlGaAs), or any mixture thereof. Each of the lower semiconductor layer LSL, the source semiconductor layer SSL, and the upper semiconductor layer USL may single-crystalline, amorphous, and/or polycrystalline. For example, each of the lower semiconductor layer LSL, the source semiconductor layer SSL, and the upper semiconductor layer USL may include a polysilicon layer into which impurities are doped to have an n-type conductivity. The lower semiconductor layer LSL, the source semiconductor layer SSL, and the upper semiconductor layer USL may have impurity concentrations different from each other.

The source semiconductor layer SSL may be interposed between the lower semiconductor layer LSL and the upper semiconductor layer USL. The source semiconductor layer SSL may electrically connect the lower semiconductor layer LSL to the upper semiconductor layer USL. For example, in a plan view, the upper semiconductor layer USL and the source semiconductor layer SSL may at least partially overlap the lower semiconductor layer LSL.

On the peripheral region PER and the scribe lane region SCL, the second substrate SL may include a lower semiconductor layer LSL, a fifth dielectric layer IL5, a lower sacrificial layer LHL, a sixth dielectric layer IL6, and an upper semiconductor layer USL that are sequentially stacked. The fifth and sixth dielectric layers IL5 and IL6 may include a silicon oxide layer, and the lower sacrificial layer LHL may include a silicon nitride layer or a silicon oxynitride layer.

The stack structure ST may be provided on the second substrate SL of the cell array region CAR. The stack structure ST may include a first stack structure ST1 and a second stack structure ST2 disposed on the first stack structure ST1. The second substrate SL may be provided with a second interlayer dielectric layer ILD2 and a third interlayer dielectric layer ILD3. The second interlayer dielectric layer ILD2 may have a top surface that is coplanar with a top surface of the first stack structure ST1. The third interlayer dielectric layer ILD3 may have a top surface that is coplanar with a top surface of the second stack structure ST2. The second and third interlayer dielectric layers ILD2 and ILD3 may at least partially cover a stepwise structure STS of the stack structure ST.

The first stack structure ST1 may include first electrodes EL1 that are stacked in a direction (e.g., a third direction D3) perpendicular to the second substrate SL. The first stack structure ST1 may further include first dielectric layers IL1 that separate the stacked first electrodes EL1 from each other. The first dielectric layers IL1 and the first electrodes EL1 of the first stack structure ST1 may be alternately stacked in the third direction D3. A second dielectric layer IL2 may be provided at top of the first stack structure ST1. The second dielectric layer IL2 may be thicker than each of the first dielectric layers IL1.

The second stack structure ST2 may include second electrodes EL2 that are stacked in the third direction D3 on the first stack structure ST1. The second stack structure ST2 may further include third dielectric layers IL3 that separate the stacked second electrodes EL2 from each other. The third dielectric layers IL3 and the second electrodes EL2 of the second stack structure ST2 may be alternately stacked in the third direction D3. A fourth dielectric layer IL4 may be provided on top of the second stack structure ST2. The fourth dielectric layer IL4 may be thicker than each of the third dielectric layers IL3.

The stack structure ST may extend in a second direction D2 from the cell array region CAR toward the peripheral region PER. The stack structure ST may have a stepwise structure STS. The stepwise structure STS of the stack structure ST may have a height that deceases with decreasing distance from the peripheral region PER. For example, the stepwise structure STS of the stack structure ST may have a height that decreases in the second direction D2.

A lowermost first electrode EL1 of the stack structure ST may be a lower selection line (e.g., the first gate lower line LL1 of FIG. 1). An uppermost second electrode EL2 of the stack structure ST may be an upper selection line (e.g., the first gate upper line UL1 of FIG. 1). The first and second electrodes EL1 and EL2, other than the lower and upper selection lines, may be word lines (e.g., the word lines WL of FIG. 1).

The first and second electrodes EL1 and EL2 may include a conductive material including doped semiconductors (e.g., doped silicon), metals (e.g., tungsten, copper, or aluminum), conductive metal nitrides (e.g., titanium nitride or tantalum nitride), and/or transition metals (e.g., titanium or tantalum). The first to fourth dielectric layers IL1 to IL4 may include a silicon oxide layer.

On the cell array region CAR, a plurality of vertical channel structures VS may penetrate the stack structure ST. Each of the vertical channel structures VS may have a diameter that gradually decreases with decreasing distance from the second substrate SL.

Each of the vertical channel structures VS may include a vertical dielectric pattern VP, a vertical semiconductor pattern SP, and a buried dielectric pattern VI. The vertical semiconductor pattern SP may be interposed between the vertical dielectric pattern VP and the buried dielectric pattern VI. A conductive pad PAD may be provided on an upper portion of each of the vertical channel structures VS.

The buried dielectric pattern VI may have cylindrical shape. The vertical semiconductor pattern SP may at least partially cover a surface of the buried dielectric pattern VI and may extend in the third direction D3 from the lower semiconductor layer LSL toward the conductive pad PAD. The vertical semiconductor pattern SP may have a pipe shape whose top end is opened. The vertical dielectric pattern VP may at least partially cover an outer surface of the vertical semiconductor pattern SP and may extend in the third direction D3 from the lower semiconductor layer LSL toward a top surface of a fourth interlayer dielectric layer ILD4 which will be discussed below. The vertical dielectric pattern VP may have a pipe shape whose top end is opened. The vertical dielectric pattern VP may be interposed between the stack structure ST and the vertical semiconductor pattern SP.

The vertical dielectric pattern VP may be formed of a single thin layer or a plurality of thin layers. In some embodiments of the present inventive concepts, the vertical dielectric pattern VP may include a data storage layer. In some example embodiments of the present inventive concepts, the vertical dielectric pattern VP may include a tunnel dielectric layer, a charge storage layer, and a blocking dielectric layer that are collectively used as a data storage layer of a NAND Flash memory device. For example, the charge storage layer may be a trap dielectric layer, a floating gate electrode, or a dielectric layer including conductive nano-dots. The charge storage layer may include a silicon nitride layer, a silicon oxynitride layer, a silicon-rich nitride layer, a nano-crystalline silicon layer, and/or a laminated trap layer.

The vertical semiconductor pattern SP may include a semiconductor material, such as silicon (Si), germanium (Ge), or a mixture thereof. Additionally or alternatively, the vertical semiconductor pattern SP may be an impurity-doped semiconductor or an undoped intrinsic semiconductor. The vertical semiconductor pattern SP including a semiconductor material may be used as a channel of transistors included in a memory cell string.

The conductive pad PAD may at least partially cover a top surface of the vertical semiconductor pattern SP and a top surface of the buried dielectric pattern VI. The conductive pad PAD may include an impurity-doped semiconductor material and/or a conductive material. A bit-line contact plug BPLG may be electrically connected through the conductive pad PAD to the vertical semiconductor pattern SP.

The source semiconductor layer SSL may directly contact a lower sidewall of each of the vertical semiconductor patterns SP. The source semiconductor layer SSL may electrically connect a plurality of vertical semiconductor patterns SP to each other. For example, the vertical semiconductor patterns SP may be simultaneously electrically connected to the second substrate SL. The second substrate SL may serve as a source of memory cells. A common source voltage may be applied to the second substrate SL.

Each of the vertical channel structures VS may include a first vertical extension VEP1 that penetrates the first stack structure ST1, a second vertical extension VEP2 that penetrates the second stack structure ST2, and an expansion EXP between the first and second vertical extensions VEP1 and VEP2. The expansion EXP may be provided in the second dielectric layer IL2.

The first vertical extension VEP1 may have a diameter that increases in a direction from a lower portion thereof toward an upper portion thereof. The second vertical extension VEP2 may have a diameter that increases in a direction from a lower portion thereof toward an upper portion thereof. The expansion EXP may have a diameter that is greater than a maximum diameter of each of the first and second vertical extensions VEP1 and VEP2.

A plurality of separation structures SPS may penetrate the stack structure ST. The separation structures SPS may separate the stack structure ST into a plurality of horizontally structures. For example, the separation structures SPS may separate one electrode EL1 or EL2 of the stack structure ST into a plurality of horizontally separated electrodes. The separation structures SPS may include a dielectric material, such as silicon oxide.

A first dummy structure DST1 may be provided on the peripheral region PER and the scribe lane region SCL of the second substrate SL. The first dummy structure DST1 may have a bottom surface that is coplanar with a bottom surface of the first stack structure ST1, and may have a top surface that is coplanar with a top surface of the first stack structure ST1.

The first dummy structure DST1 may include first sacrificial layers HL1 that are stacked in the third direction D3 on the second substrate SL. The first dummy structure DST1 may further include first dielectric layers IL1 that separate the stacked first sacrificial layers HL1 from each other. The first sacrificial layers HL1 and the first dielectric layers IL1 of the first dummy structure DST1 may be alternately stacked in the third direction D3. A second dielectric layer IL2 may be provided at top of the first dummy structure DST1. The second dielectric layer IL2 of the first dummy structure DST1 may have a thickness that is substantially the same as a thickness of the second dielectric layer IL2 of the first stack structure ST1.

A second dummy structure DST2 may be provided on the second interlayer dielectric layer ILD2 and the first dummy structure DST1 of the peripheral region PER and the scribe lane region SCL. The second dummy structure DST2 may have a bottom surface that is coplanar with a bottom surface of the second stack structure ST2, and may have a top surface that is coplanar with a top surface of the second stack structure ST2.

The second dummy structure DST2 may include second sacrificial layers HL2 that are stacked in the third direction D3 on the first dummy structure DST1. The second dummy structure DST2 may further include third dielectric layers IL3 that separate the stacked second sacrificial layers HL2 from each other. The second sacrificial layers HL2 and the third dielectric layers IL3 of the second dummy structure DST2 may be alternately stacked in the third direction D3. A fourth dielectric layer IL4 may be provided at top of the second dummy structure DST2.

The first and second dummy structures DST1 and DST2 provided on the peripheral region PER may extend along the second direction D2 to the scribe lane region SCL. For example, the dummy structure DST on the scribe lane region SCL may be the first and second dummy structures DST1 and DST2 that extend in the second direction D2 on the peripheral region PER.

The peripheral region PER on an outer area of a semiconductor chip may be provided with stress due to thermal expansion during a process that forms the stack structure ST, the vertical channel structures VS, and following described bit lines BL on the second substrate SL. Therefore, an outer area of the peripheral region PER might not be provided thereon with any transistors or vertical channel structures that participate in operation of a semiconductor chip. For example, there may be limitations on arrangement of components on the cell array region CAR and the peripheral region PER of a single semiconductor chip.

As the dummy structure DST extends from the peripheral region PER to the scribe lane region SCL, a region where stress is produced may migrate from the outer area of the peripheral region PER to the scribe lane region SCL. For example, stress due to thermal expansion of the peripheral region PER may be reduced when the dummy structure DST is provided in common on the peripheral region PER and the scribe lane region SCL in comparison with when the dummy structures DST are separated between the peripheral region PER and the scribe lane region SCL.

Thus, according to inventive concepts, there may be an expansion of the cell array region CAR and a reduction in occupying area of the dummy structure DST on the peripheral region PER, compared to a case where the dummy structures DST are separated between the peripheral region PER and the scribe lane region SCL.

The first and second dummy structures DST1 and DST2 provided on the peripheral region PER may serve as a buffer between the stack structure ST of the cell array region CAR and the dummy structure DST of the scribe lane region SCL.

On the scribe lane region SCL, slit arrays SLA may penetrate the dummy structure DST. The slit arrays SLA may be arranged along the second direction D2. Each of the slit arrays SLA may include a plurality of slits SLT. A single slit array SLA may be formed by the plurality of slits SLT arranged along the first direction D1. For example, the plurality of slits SLT may be arranged in the first direction D1 on the scribe lane region SCL.

Each slit SLT may include a first slit SLT1 and a second slit SLT2. The first slit SLT1 may penetrate the first dummy structure DST1 on the scribe lane region SCL, and the second slit SLT2 may penetrate the second dummy structure DST2 on the first dummy structure DST1 and may connect with the first slit SLT1 of the first dummy structure DST1. Each of the first and second slits SLT1 and SLT2 may have a diameter that progressively decreases with decreasing distance from the second substrate SL.

Each slit SLT may include a slit dielectric layer SI and a void SV. The void SV may be at least partially surrounded by the slit dielectric layer SI. For example, each slit SLT may include an empty area at least partially surrounded by the slit dielectric layer SI. The slit dielectric layer SI may include the same material as that of the vertical dielectric pattern VP of the vertical channel structure VS. The void SV may, for example, be filled with air or may be substantially evacuated.

A semiconductor device, according to embodiments of the present inventive concepts, may include a plurality of slits SLT that are provided on the scribe lane region SCL. Thus, there may be additional separation between semiconductor chips in a separation process on the scribe lane region SCL, compared to a case where the slits SLT are absent on the scribe lane region SCL.

The separation process may include a grinding after laser (GAL) process. The GAL process may include irradiating the scribe lane region SCL with a laser to cut the dummy structure DST, grinding a top surface of the dummy structure DST, and then physically separating chips from each other.

When the scribe lane region SCL is irradiated by a laser in a procedure of the GAL process, cracks may occur in the dummy structure DST. When the slit SLT is absent on the scribe lane region SCL, the cracks may be formed along interfaces between the dielectric layers IL1, IL2, and IL3 and the sacrificial layers HL1 and HL2 of the dummy structure DST to move in the second direction D2 into the peripheral region PER and the cell array region CAR. In contrast, when a plurality of slits SLT are provided on the scribe lane region SCL, the cracks may be formed in the third direction D3 along the slit SLT.

As a result, according to a semiconductor memory according to the present inventive concepts, additional separation may be provided in a separation process on the scribe lane region SCL, and the cell array region CAR and the peripheral region PER may be protected. Therefore, it may be possible to reduce an amount of production of defective chip in the separation process and thus to increase a process yield.

A fourth interlayer dielectric layer ILD4 may be provided on the stack structure ST and the dummy structure DST.

A fifth interlayer dielectric layer ILD5 may be provided on the fourth interlayer dielectric layer ILD4. A plurality of bit-line contact plugs BPLG may penetrate the fifth interlayer dielectric layer ILD5 and may be coupled to the conductive pads PAD. A plurality of bit lines BL may be disposed on the fifth interlayer dielectric layer ILD5. The bit lines BL may extend in the first direction D1. The bit lines BL may be correspondingly electrically connected through bit-line contact plugs BPLG to the vertical channel structure VS.

A plurality of cell contact plugs CPLG may penetrate the second, third, fourth, and fifth interlayer dielectric layers ILD2, ILD3, ILD4, and ILD5 and may be coupled to the first and second electrodes EL1 and EL2 of the stepwise structure STS. A plurality of upper wiring lines UIL may be disposed on the fifth interlayer dielectric layer ILD5. The upper wiring lines UIL may be correspondingly electrically connected through the cell contact plugs CPLG to the first and second electrodes EL1 and EL2.

FIGS. 7A, 8A, 9A, 10A, 11A, 12A, 13A, 14A, and 15A are cross-sectional views taken along line I-I' of FIG. 5, showing a method of fabricating a semiconductor device according to some embodiments of the present inventive concepts. FIGS. 7B, 8B, 9B, 10B, 11B, 12B, 13B, 14B, and 15B are cross-sectional views taken along line II-II' of FIG. 5, showing a method of fabricating a semiconductor device according to some embodiments of the present inventive concepts.

Figure 7A:
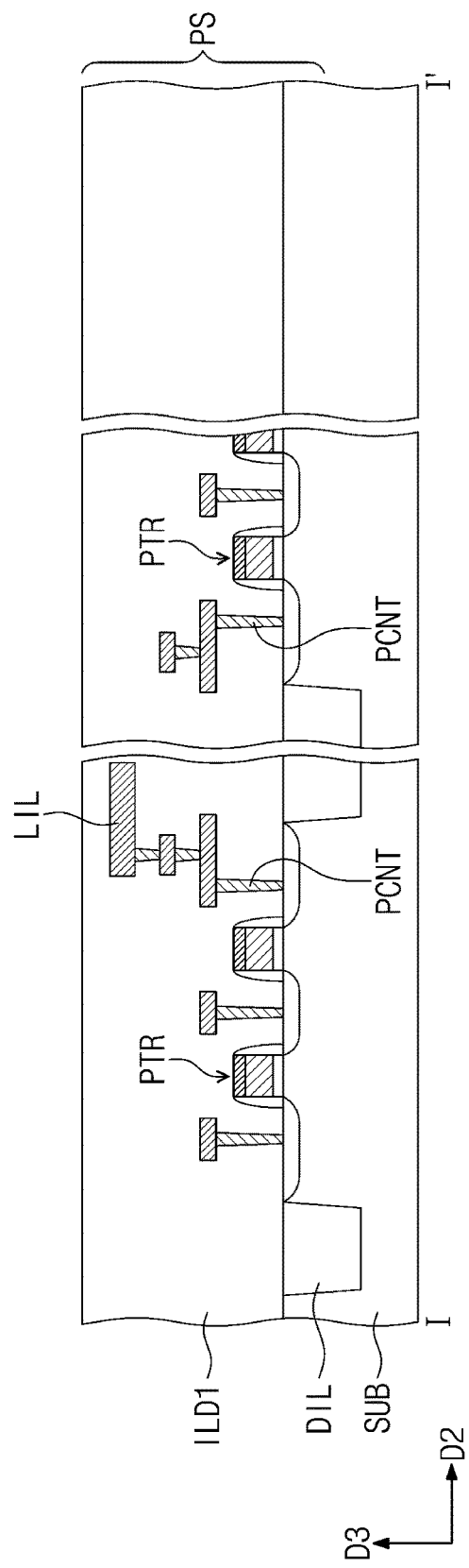
FIGS. 7A, 8A, 9A, 10A, 11A, 12A, 13A, 14A, and 15A are cross-sectional views taken along line I-I' of FIG. 5, showing a method of fabricating a semiconductor device according to some embodiments of the present inventive concepts.
Figure 7B:
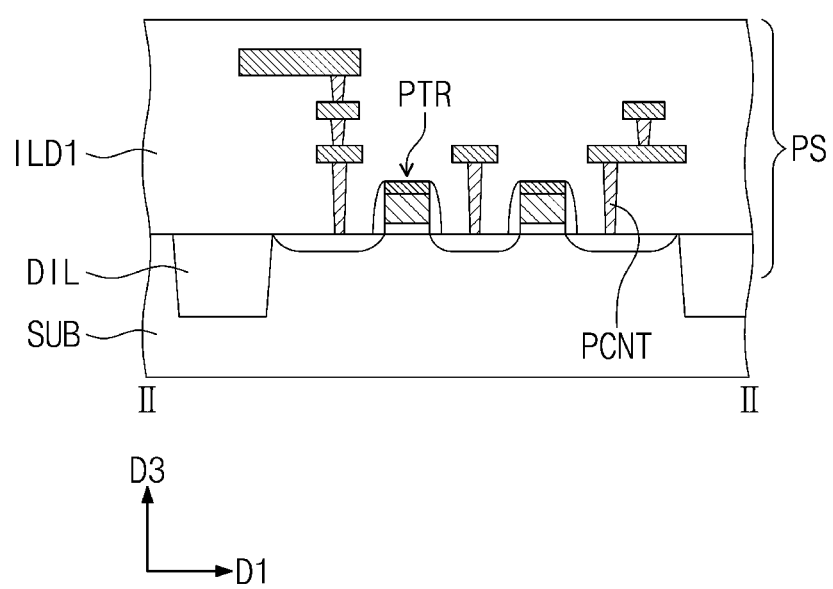
FIGS. 7B, 8B, 9B, 10B, 11B, 12B, 13B, 14B, and 15B are cross-sectional views taken along line II-II' of FIG. 5, showing a method of fabricating a semiconductor device according to some embodiments of the present inventive concepts.

Referring to FIGS. 5, 7A, and 7B, a peripheral circuit structure PS may be formed on a first substrate SUB. The formation of the peripheral circuit structure PS may include forming peripheral transistors PTR on the first substrate SUB and forming lower wiring lines LIL on the peripheral transistors PTR. For example, the formation of the peripheral transistors PTR may include forming a device isolation layer DIL on the first substrate SUB that defines active regions, forming a gate dielectric layer and a gate electrode on the active regions, and doping the active regions with impurities to form source/drain regions. A first interlayer dielectric layer ILD1 may at least partially cover the peripheral transistors PTR and the lower wiring lines LIL.

Figure 8A:
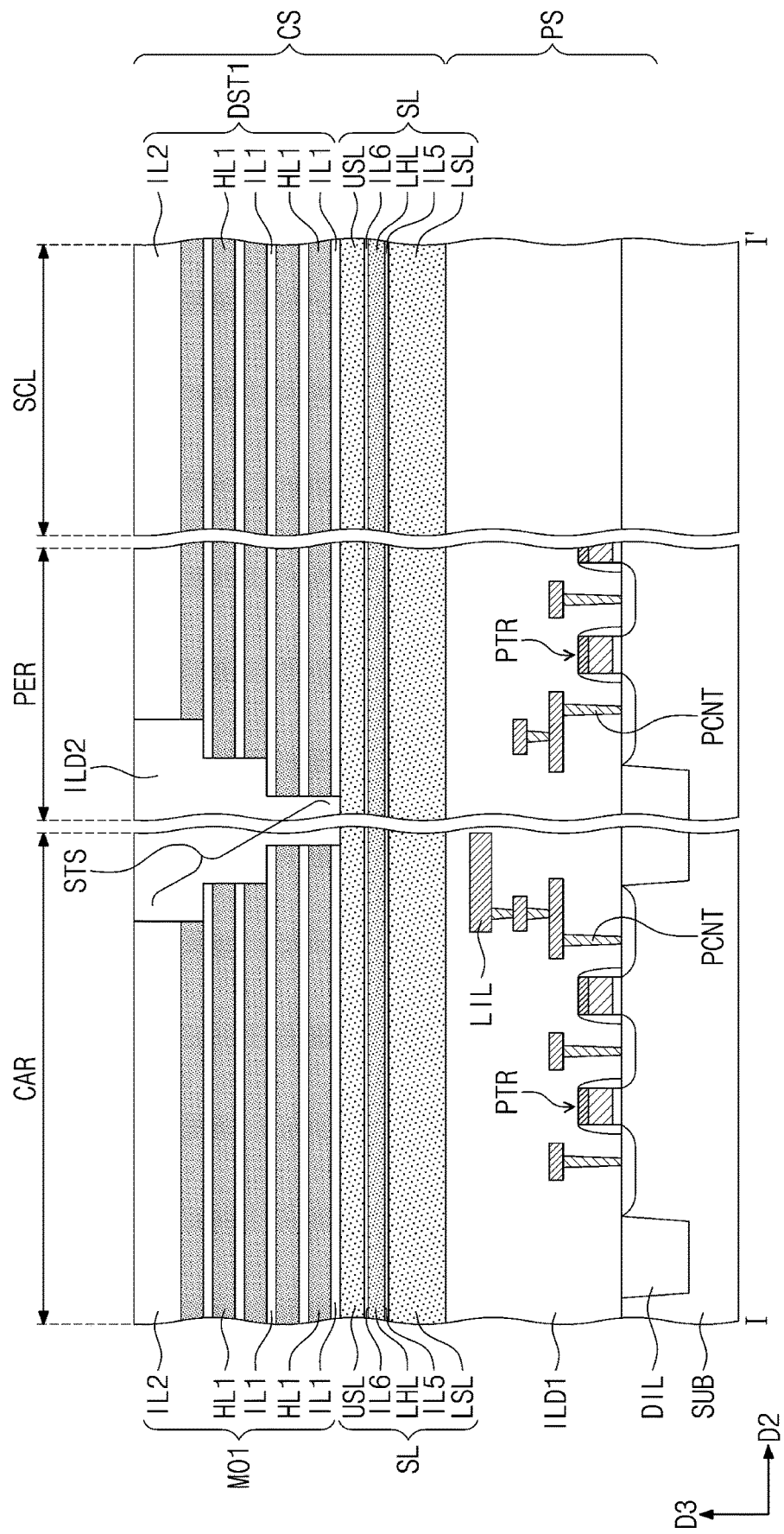
Figure 8B:
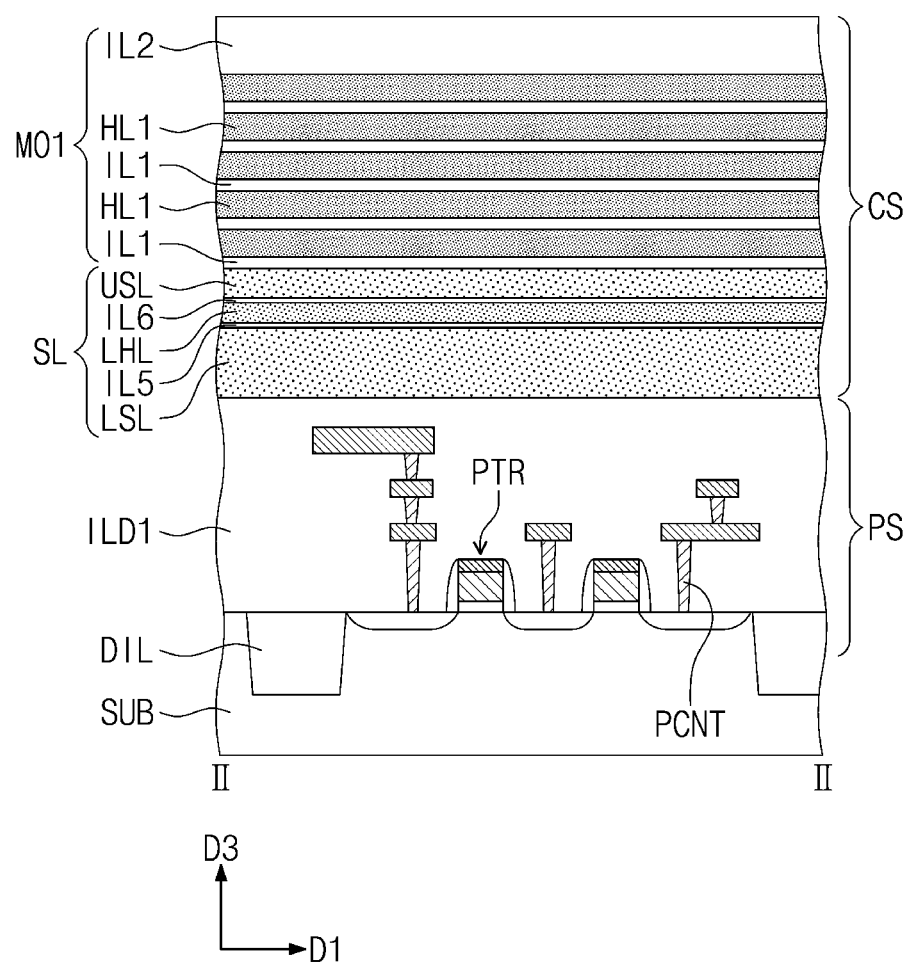

Referring to FIGS. 5, 8A, and 8B, a second substrate SL may be formed on the first interlayer dielectric layer ILD1. The formation of the second substrate SL may include sequentially forming a lower semiconductor layer LSL, a fifth dielectric layer IL5, a lower sacrificial layer LHL, a sixth dielectric layer IL6, and an upper semiconductor layer USL. For example, the lower semiconductor layer LSL and the upper semiconductor layer USL may include a semiconductor material, such as polysilicon. The fifth and sixth dielectric layers IL5 and IL6 may include a silicon oxide layer, and the lower sacrificial layer LHL may include a silicon nitride layer or a silicon oxynitride layer. The second substrate SL may include a cell array region CAR, a peripheral region PER, and a scribe lane region SCL.

A first mold structure MO1 may be formed on the cell array region CAR of the second substrate SL. For example, first dielectric layers IL1 and first sacrificial layers HL1 may be alternately stacked on the upper semiconductor layer USL, thereby forming the first mold structure MO1. A second dielectric layer IL2 may be formed at top of the first mold structure MO1.

The first dielectric layers IL1, the first sacrificial layers HL1, and the second dielectric layer IL2 may be deposited by using thermal chemical vapor deposition (CVD), plasma enhanced CVD, physical CVD, or atomic layer deposition (ALD). The first dielectric layers IL1 and the second dielectric layer IL2 may include a silicon oxide layer, and the first sacrificial layers HL1 may include a silicon nitride layer or a silicon oxynitride layer.

A stepped structure STS may be formed at an end of the first mold structure MO1. For example, the first mold structure MO1 may undergo a cyclic process to form the stepwise structure STS. The formation of the stepwise structure STS may include forming a mask pattern on the first mold structure MO1 and using the mask pattern to repeatedly perform the cyclic process several times. One cyclic process may include a process in which the mask pattern is used as an etching mask to etch a portion of the first mold structure MO1 and may also include a process in which the mask pattern is contracted.

A first dummy structure DST1 may be formed on the peripheral region PER and the scribe lane region SCL of the second substrate SL. The first dummy structure DST1 may be formed simultaneously with the first mold structure MO1. For example, first dielectric layers IL1 and first sacrificial layers HL1 may be alternately stacked on the upper semiconductor layer USL, forming the first dummy structure DST1.

A second interlayer dielectric layer ILD2 may be formed on the first mold structure MO1 and the first dummy structure DST1. The formation of the second interlayer dielectric layer ILD2 may include forming a dielectric layer that at least partially covers the first mold structure MO1 and performing a planarization process on the dielectric layer until the second dielectric layer IL2 is exposed.

Figure 9A:
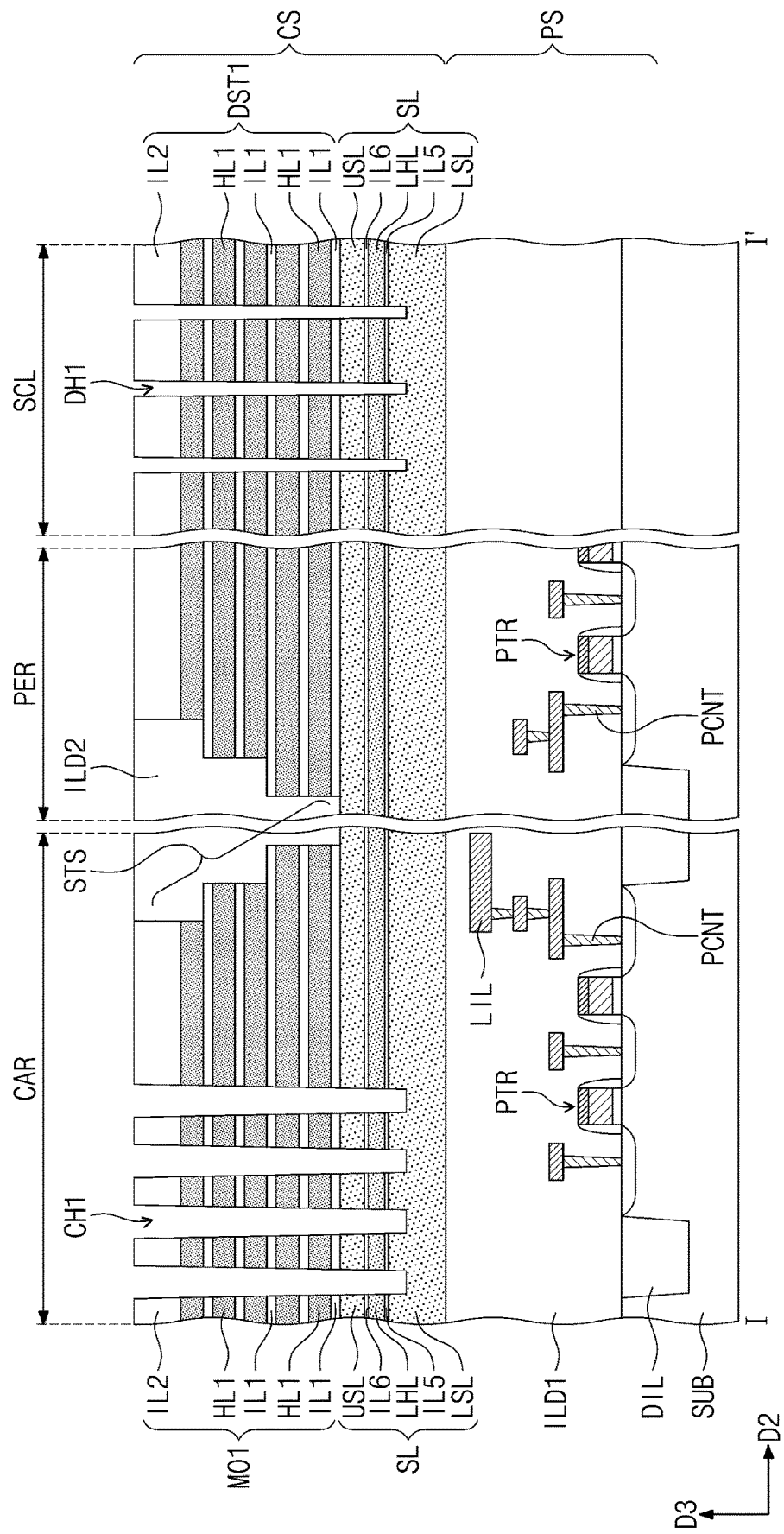
Figure 9B:
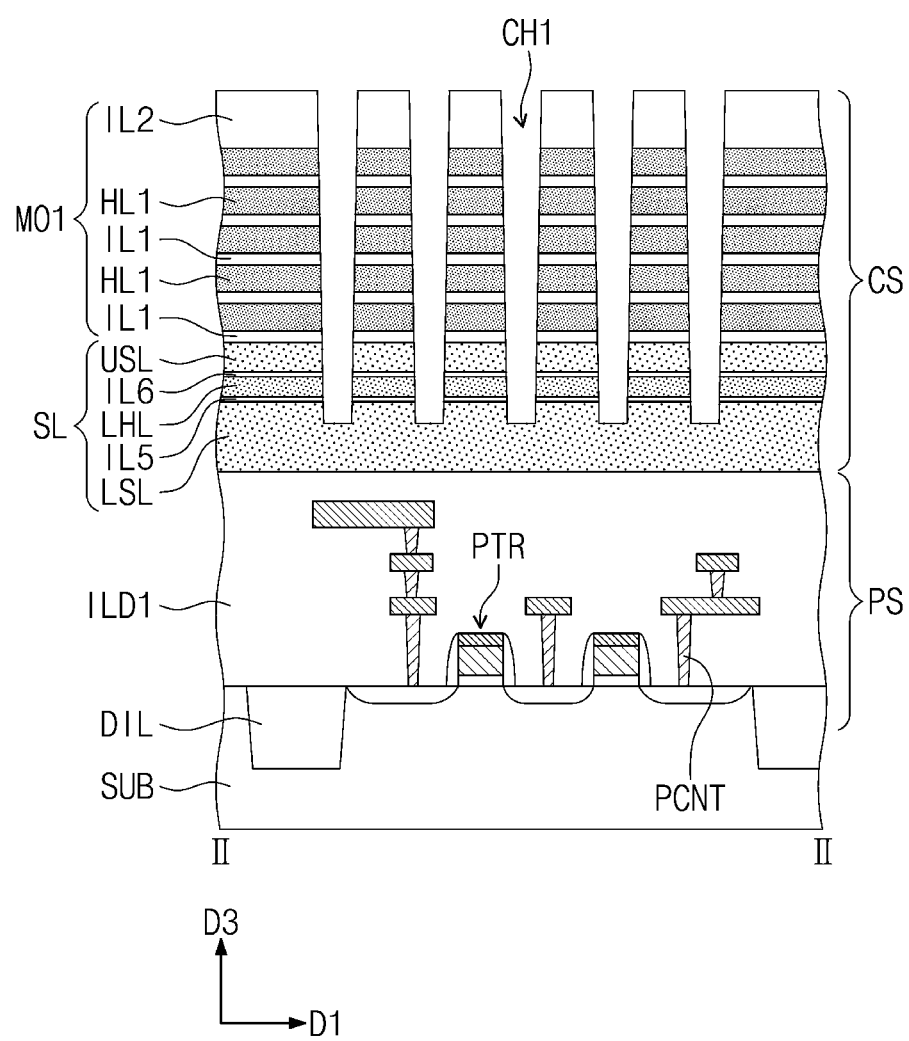

Referring to FIGS. 5, 9A, and 9B, on the cell array region CAR, first channel holes CH1 may penetrate the first mold structure MO1. On the scribe lane region SCL, first dummy holes DH1 may penetrate the first dummy structure DST1. The first channel holes CH1 and the first dummy holes DH1 may each expose the lower semiconductor layer LSL.

For example, the formation of the first channel holes CH1 and the first dummy holes DH1 may include forming on the first mold structure MO1 and the first dummy structure DST1 a mask pattern having openings that define areas where holes will be formed, and using the mask pattern as an etching mask to performing an anisotropic etching process on the first mold structure MO1 and the first dummy structure DST1. The anisotropic etching process may include a plasma etching process, a reactive ion etching (RIE) process, a radio-frequency inductively coupled plasma reactive ion etching (ICP-RIE) process, or an ion beam etching (IBE) process.

The patterning process for forming the first channel holes CH1 and the first dummy holes DH1 may include a lithography process that uses an extreme ultraviolet (EUV) radiation. In this description, the EUV may mean an ultraviolet ray having a wavelength of about 4 nm to about 124 nm, or may mean an ultraviolet ray having a wavelength of about 4 nm to about 20 nm, or may mean an ultraviolet ray having a wavelength of about 13.5 nm. The EUV may denote light whose energy is in the range of about 6.21 eV to about 124 eV, for example, from about 90 eV to about 95 eV.

The lithography process that uses the EUV may include exposure and development processes that use the EUV to expose a photoresist layer. For example, the photoresist layer may be an organic photoresist that contains an organic polymer such as polyhydroxystyrene. The organic photoresist may further include a photosensitive compound that is sensitive to the EUV. The organic photoresist may additionally include a material whose EUV absorption coefficient is high, for example, an organometallic material, an iodine-containing material, or a fluorine-containing material. For example, the photoresist layer may be an inorganic photoresist that contains an inorganic material, such as tin oxide.

The photoresist layer may be relatively thin. The photoresist layer exposed to the EUV may be developed to form photoresist patterns. In a plan view, the photoresist patterns may have a linear shape that extends in one direction, an island shape, a zigzag shape, a honeycomb shape, or a circular shape, but the present inventive concepts are not necessarily limited to a particular example.

The photoresist patterns may be used as an etching mask to pattern one or more mask layers that are stacked below the photoresist patterns, and thus mask patterns may be formed. The mask patterns may be used as an etching mask to pattern a target layer to form desired patterns on a wafer.

A pattern density of the first dummy holes DH1 may be greater than that of the first channel holes CH1. For example, the number of the first dummy holes DH1 formed on a unit area may be greater than that of the first channel holes CH1 formed on the unit area.

Figure 10A:
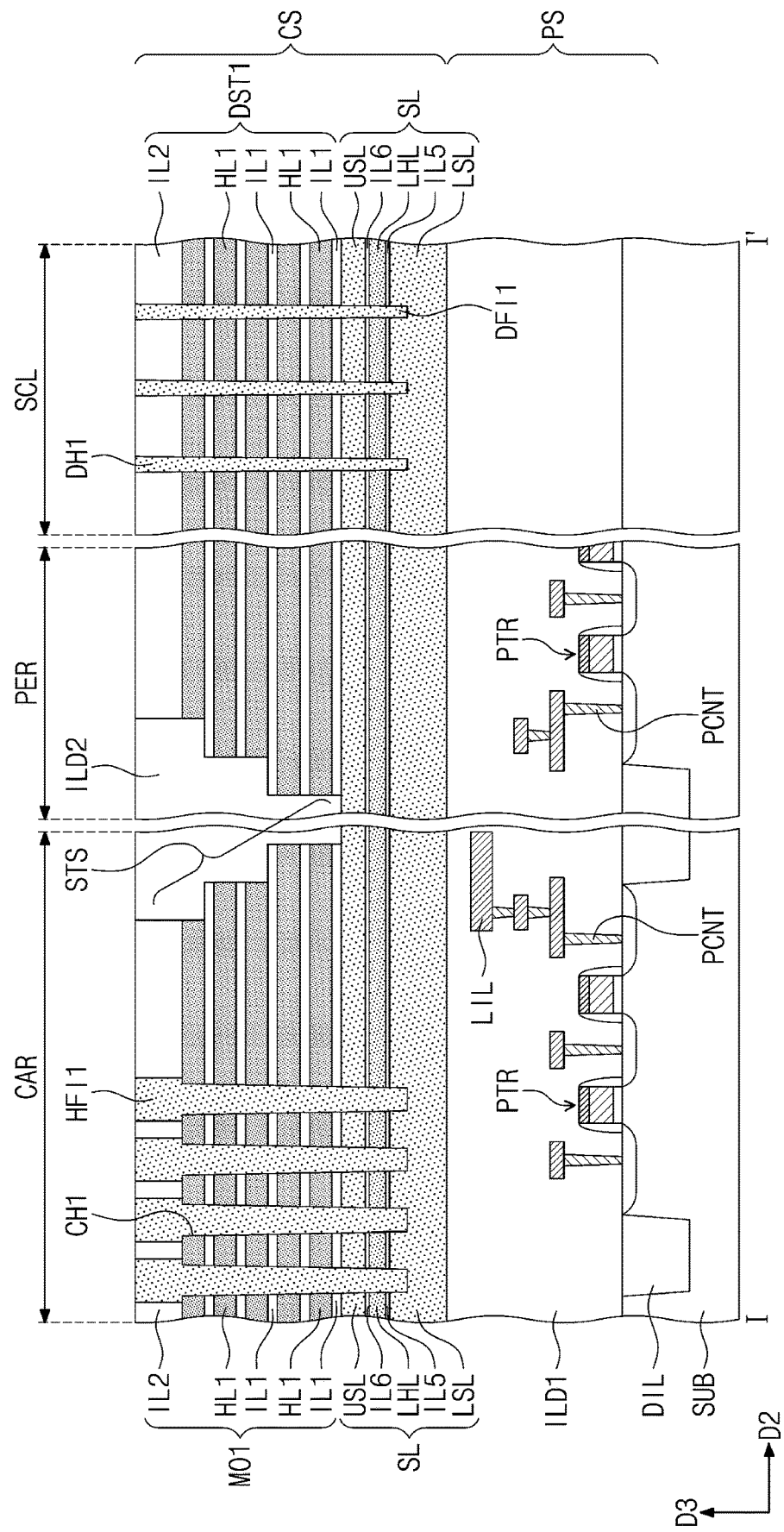
Figure 10B:
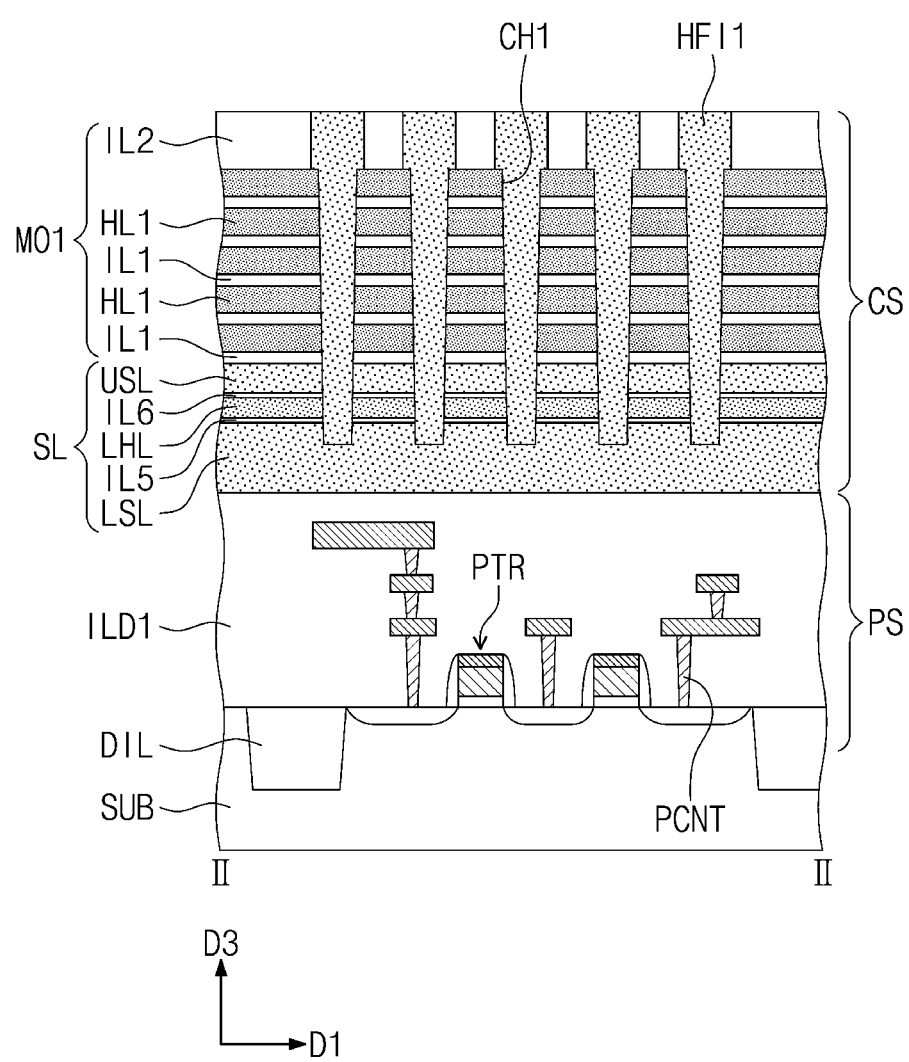

Referring to FIGS. 5, 10A, and 10B, each of the first channel holes CH1 may be expanded at its upper portion. Therefore, a diameter of the first channel hole CH1 may abruptly increase in the second dielectric layer IL2.

A plurality of first sacrificial pillars HFI1 may correspondingly fill the first channel holes CH1. A plurality of first dummy pillars DFI1 may correspondingly fill the first dummy holes DH1. For example, the formation of the first sacrificial pillars HFI1 and the first dummy pillars DFI1 may include forming a first sacrificial mask layer to fill the first channel holes CH1 and the first dummy holes DH1, and planarizing the first sacrificial mask layer until a top surface of the second dielectric layer IL2 is exposed. For example, the first sacrificial mask layer may include polysilicon.

Figure 11A:
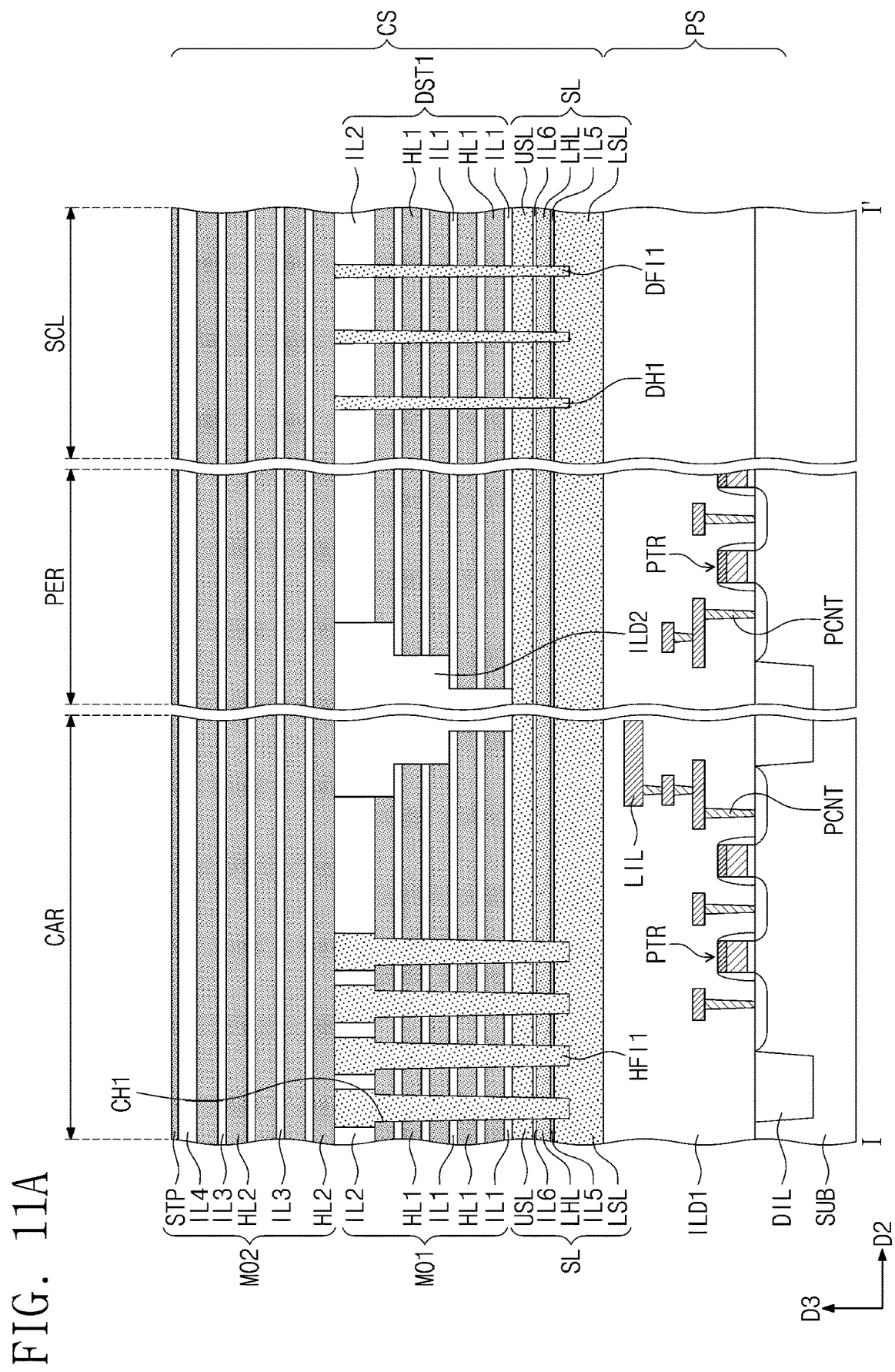
Figure 11B:
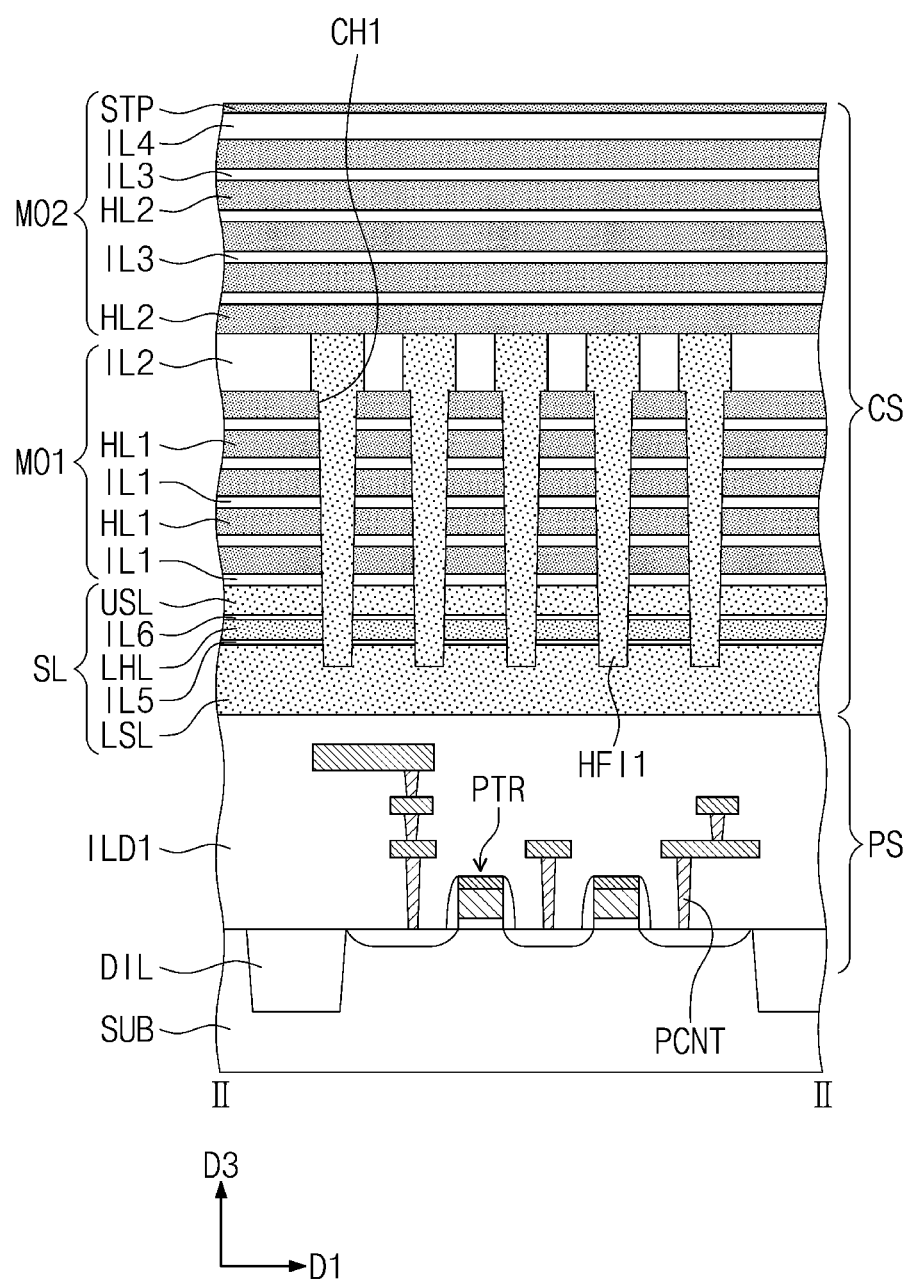

Referring to FIGS. 5, 11A, and 11B, a second mold structure MO2 may be formed on an entire surface of the second substrate SL. For example, third dielectric layers IL3 and second sacrificial layers HL2 may be alternately stacked on the first mold structure MO1, the second interlayer dielectric layer ILD2, and the first dummy structure DST1, thereby forming the second mold structure MO2. A fourth dielectric layer IL4 and a stopper layer STP may be formed at top of the second mold structure MO2. The third dielectric layers IL3 and the fourth dielectric layer IL4 may include a silicon oxide layer, and the second sacrificial layers HL2 and the stopper layer STP may include a silicon nitride layer or a silicon oxynitride layer.

Figure 12A:
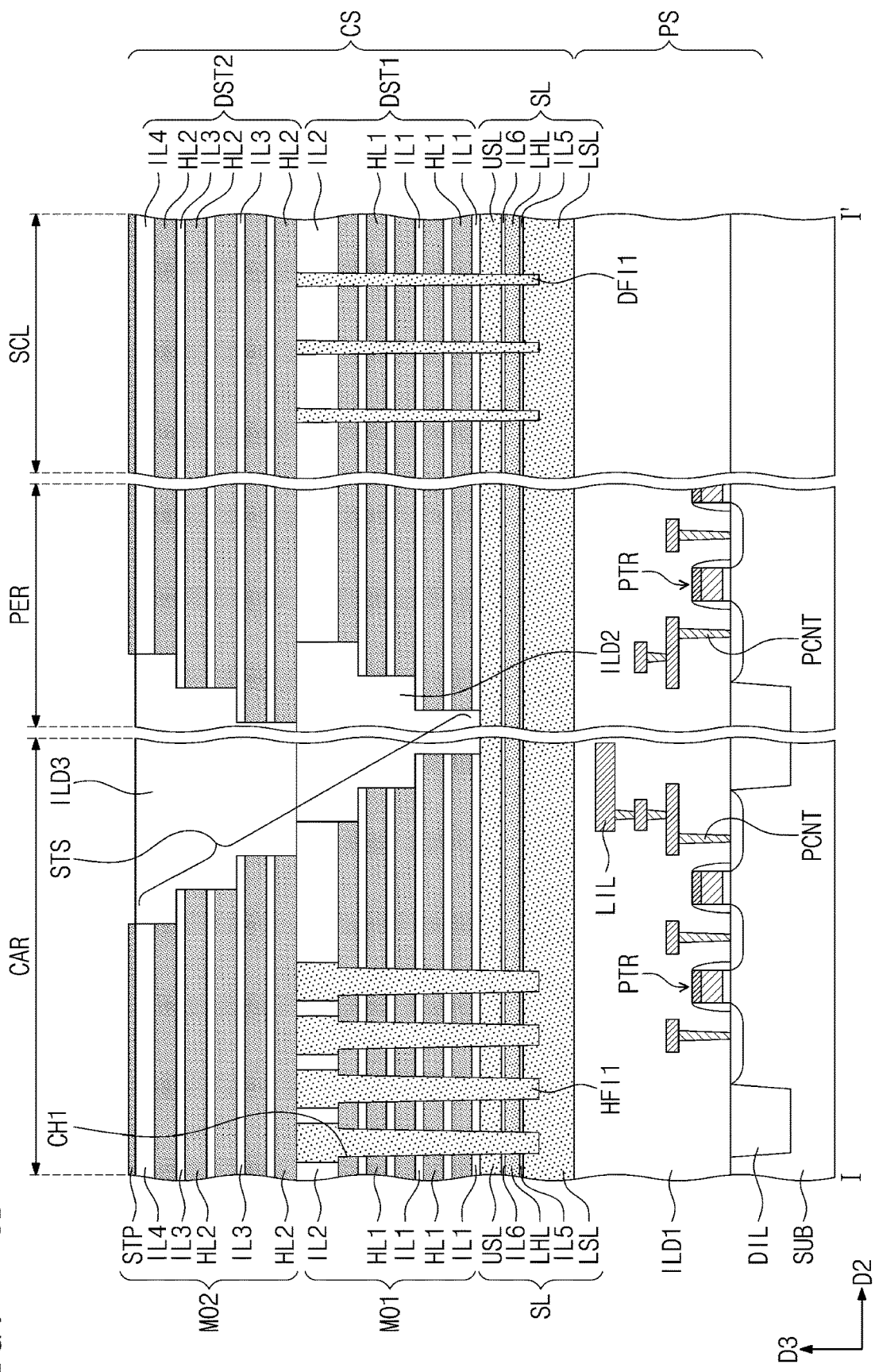
Figure 12B:
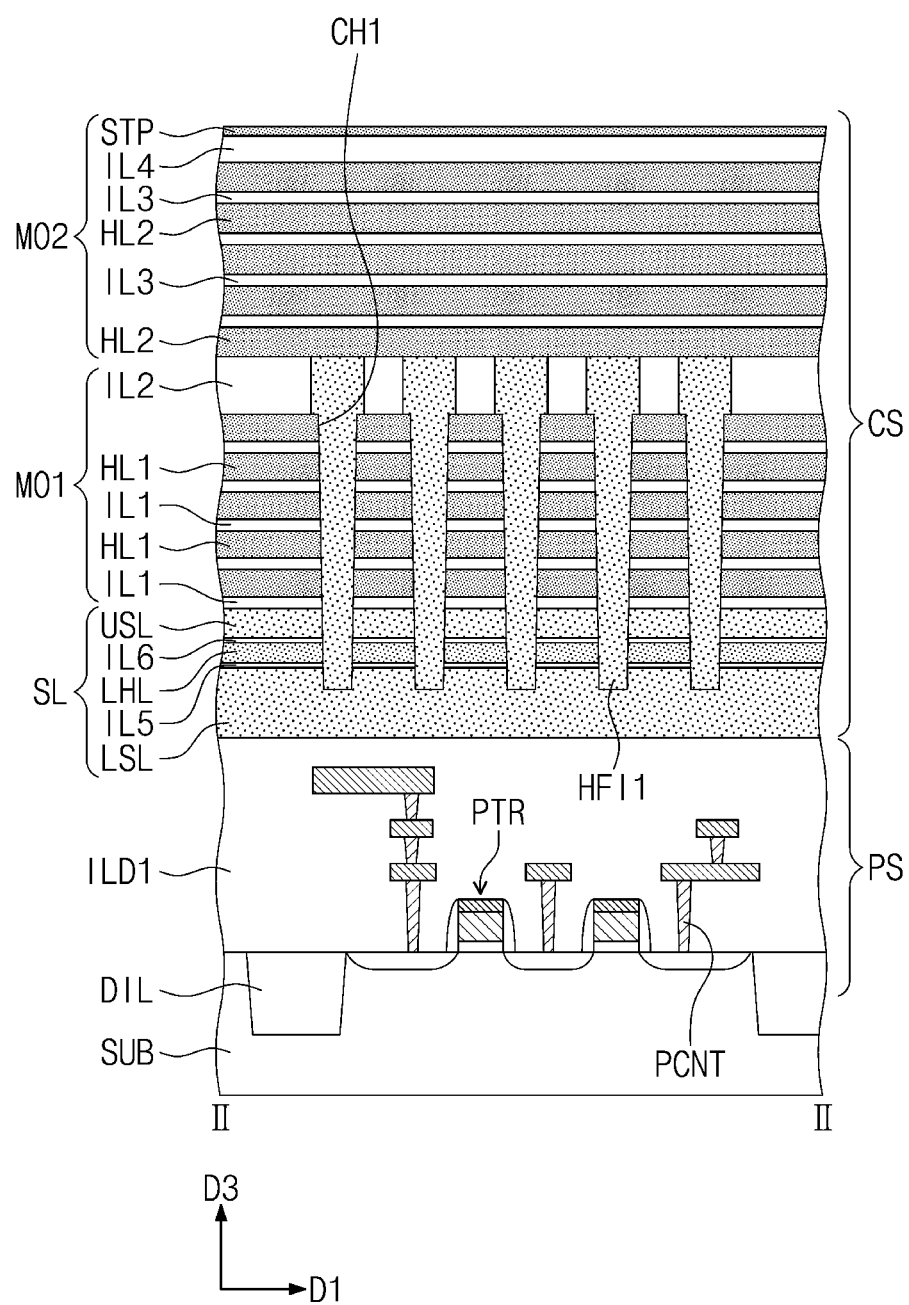

Referring to FIGS. 5, 12A, and 12B, the second mold structure MO2 on the cell array region CAR may be patterned to form a stepwise structure STS. The formation of the stepwise structure STS on the second mold structure MO2 on the cell array region CAR may be substantially the same as the formation of the stepwise structure STS on the first mold structure MO1 discussed above.

On the peripheral region PER, the second mold structure MO2 may be patterned to form a second dummy structure DST2. The second dummy structure DST2 may be simultaneously formed in a process that forms the stepwise structure STS on the cell array region CAR.

The second mold structure MO2 may remain on the scribe lane region SCL. The second mold structure MO2 remaining on the scribe lane region SCL may constitute the second dummy structure DST2 on the first dummy structure DST1.

A third interlayer dielectric layer ILD3 may be formed on the second mold structure MO2 and the second dummy structure DST2. The formation of the third interlayer dielectric layer ILD3 may include forming a dielectric layer that at least partially covers the second mold structure MO2 and the second dummy structure DST2, and then performing a planarization process on the dielectric layer until the stopper layer STP is exposed.

Figure 13A:
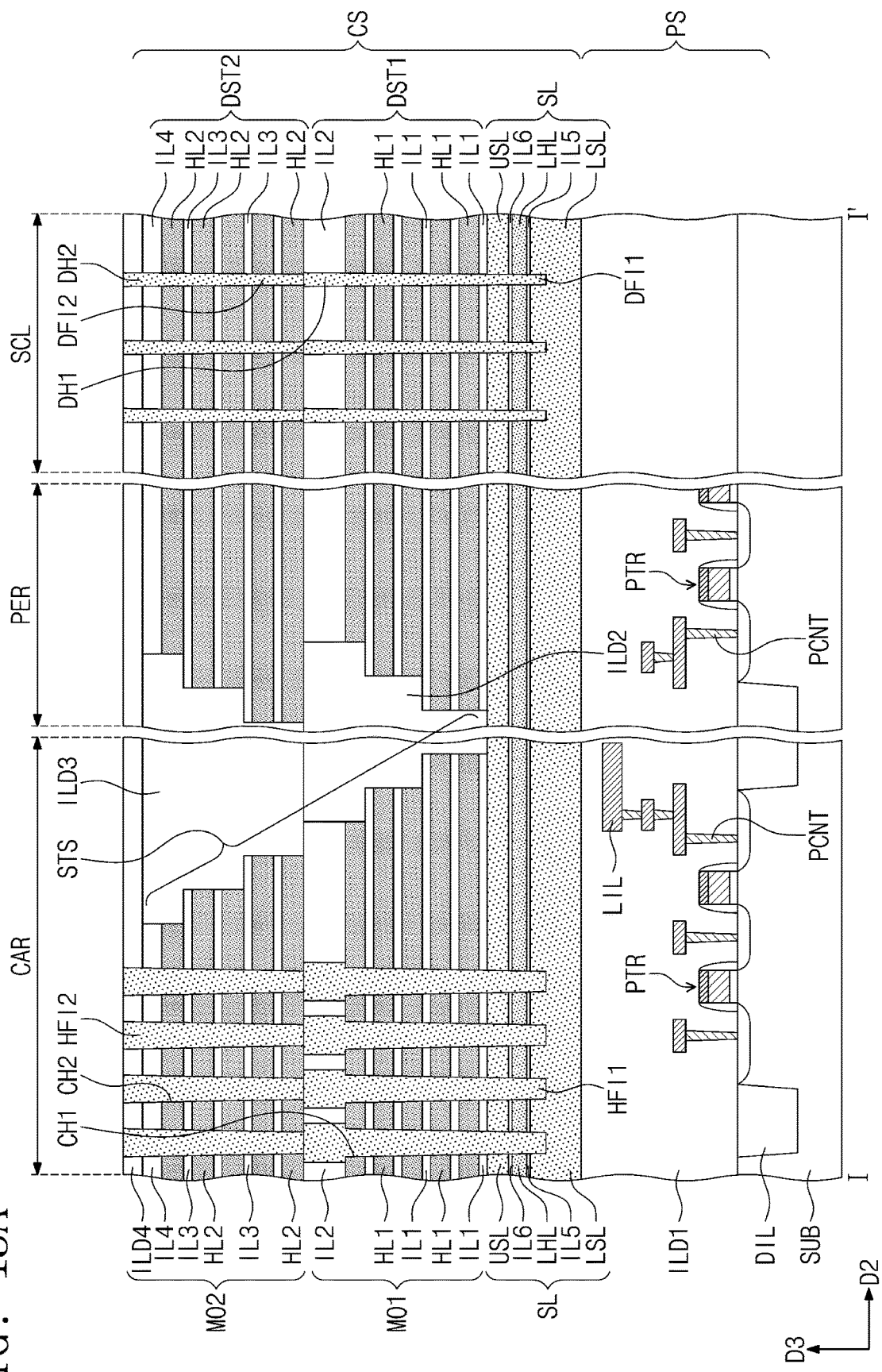
Figure 13B:
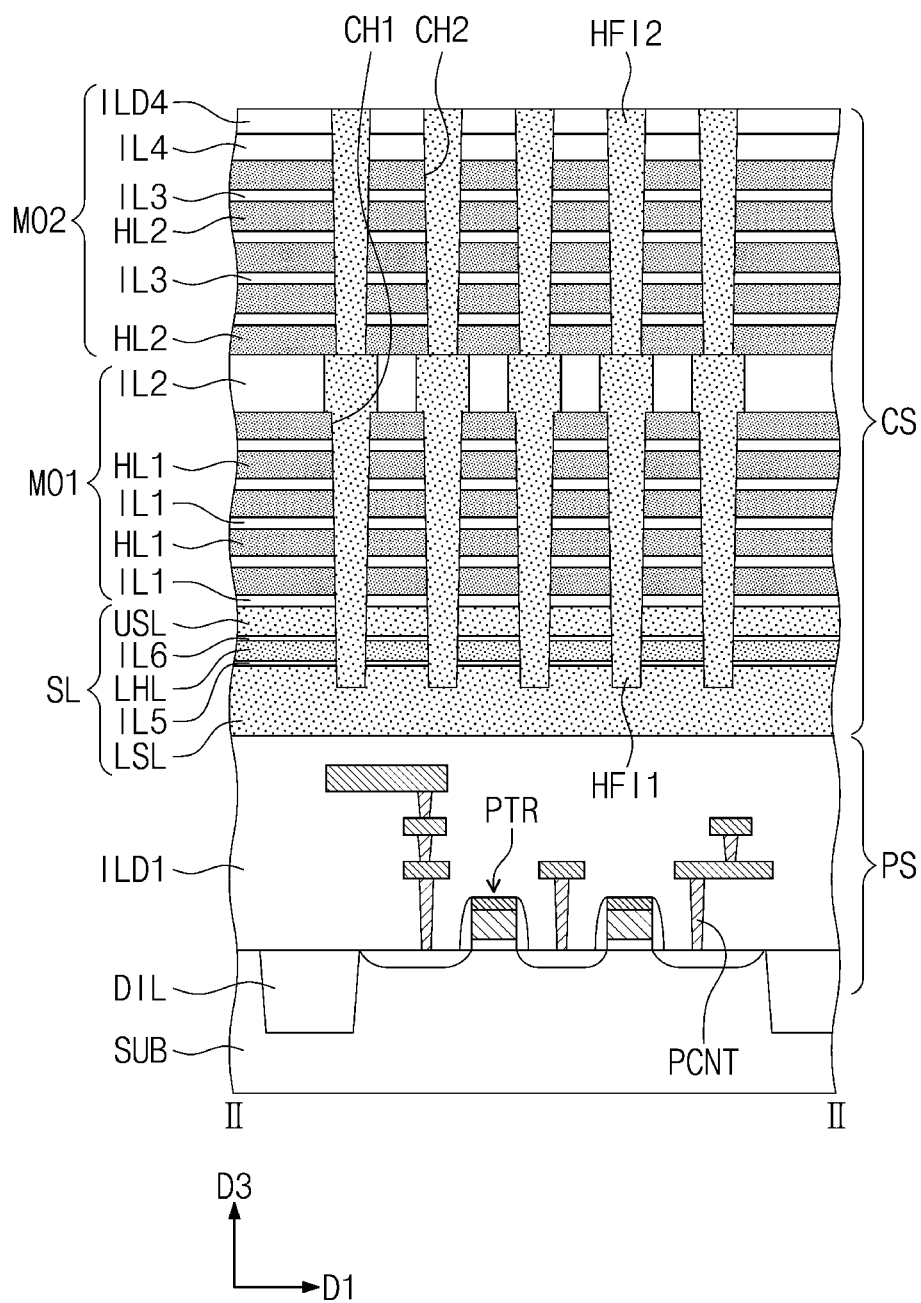

Referring to FIGS. 5, 13A, and 13B, a remaining stopper layer STP may be removed. After the removal of the stopper layer STP, a fourth interlayer dielectric layer ILD4 may be formed on an entire surface of the first substrate SUB.

A plurality of second channel holes CH2 may penetrate the second mold structure MO2. The second channel holes CH2 may at least partially overlap corresponding first sacrificial pillars HFI1 in the vertical direction.

A plurality of second dummy holes DH2 may penetrate the second dummy structure DST2. The second dummy holes DH2 may at least partially overlap corresponding first dummy holes DH1 in the vertical direction.

A photolithography process may be used to form the second channel holes CH2 and the second dummy holes DH2. For example, the formation of the second channel holes CH2 and the second dummy holes DH2 may include using a photolithography process to form a photoresist pattern (and its underlying mask pattern) having openings that define positions where the second channel holes CH2 and the second dummy holes DH2 will be formed and using the photoresist pattern as an etching mask to perform an anisotropic etching process. A detailed formation of the second channel holes CH2 and the second dummy holes DH2 may be substantially the same as the formation of the first channel holes CH1 and the first dummy holes DH1.

A plurality of second sacrificial pillars HFI2 may correspondingly fill the second channel holes CH2. The second sacrificial pillars HFI2 may at least partially overlap corresponding first sacrificial pillars HFI1 in the vertical direction. A plurality of second dummy pillars DFI2 may correspondingly fill the second dummy holes DH2. The second dummy pillars DFI2 may at least partially overlap corresponding first dummy pillars DFI1 in the vertical direction.

For example, the formation of the second sacrificial pillars HFI2 and the second dummy pillars DFI2 may include forming a second sacrificial mask layer that fills the second channel holes CH2 and the second dummy holes DH2, and planarizing the second sacrificial mask layer until a top surface of the fourth interlayer dielectric layer ILD4 is exposed. For example, the second sacrificial mask layer may include polysilicon.

Figure 14A:
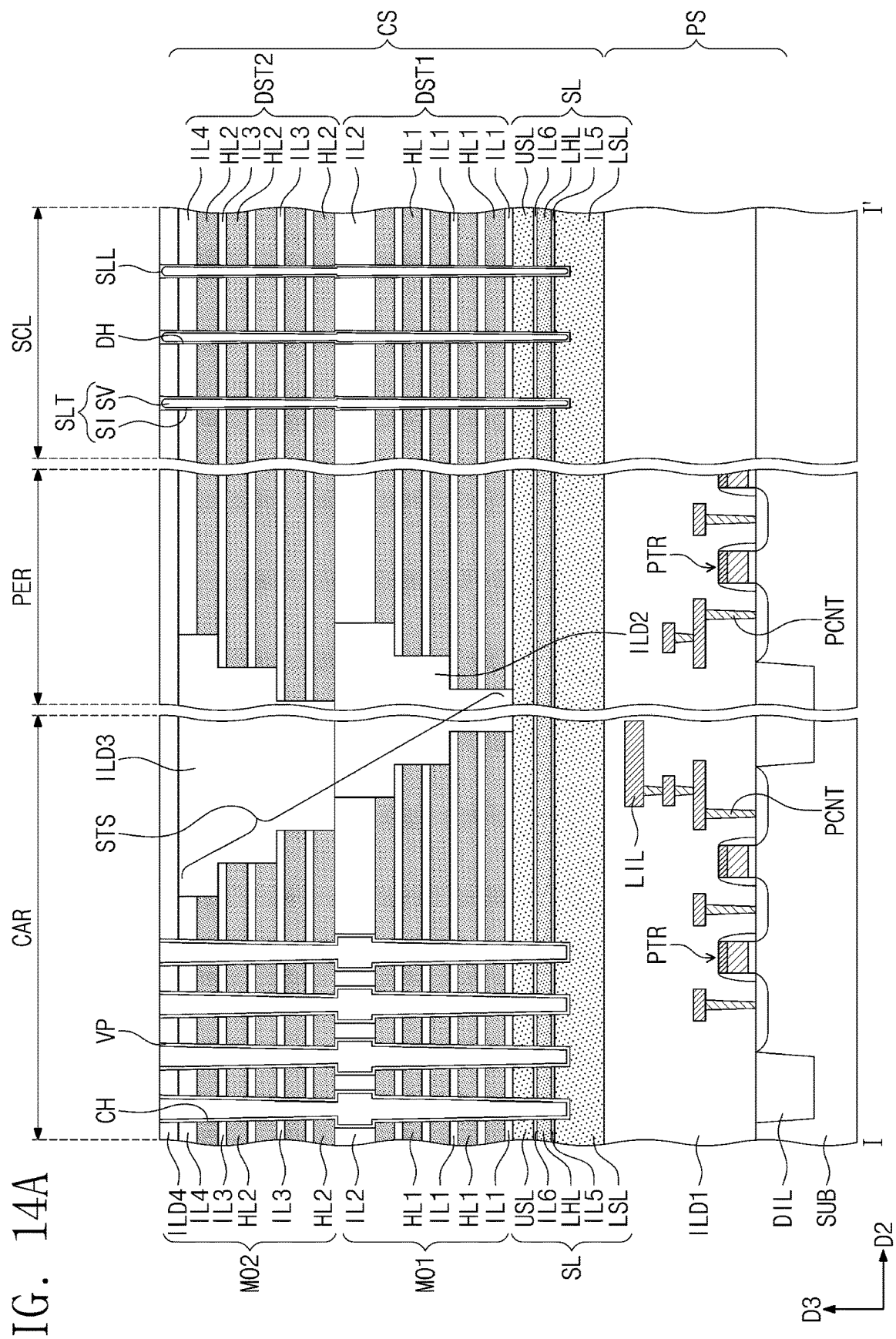
Figure 14B:
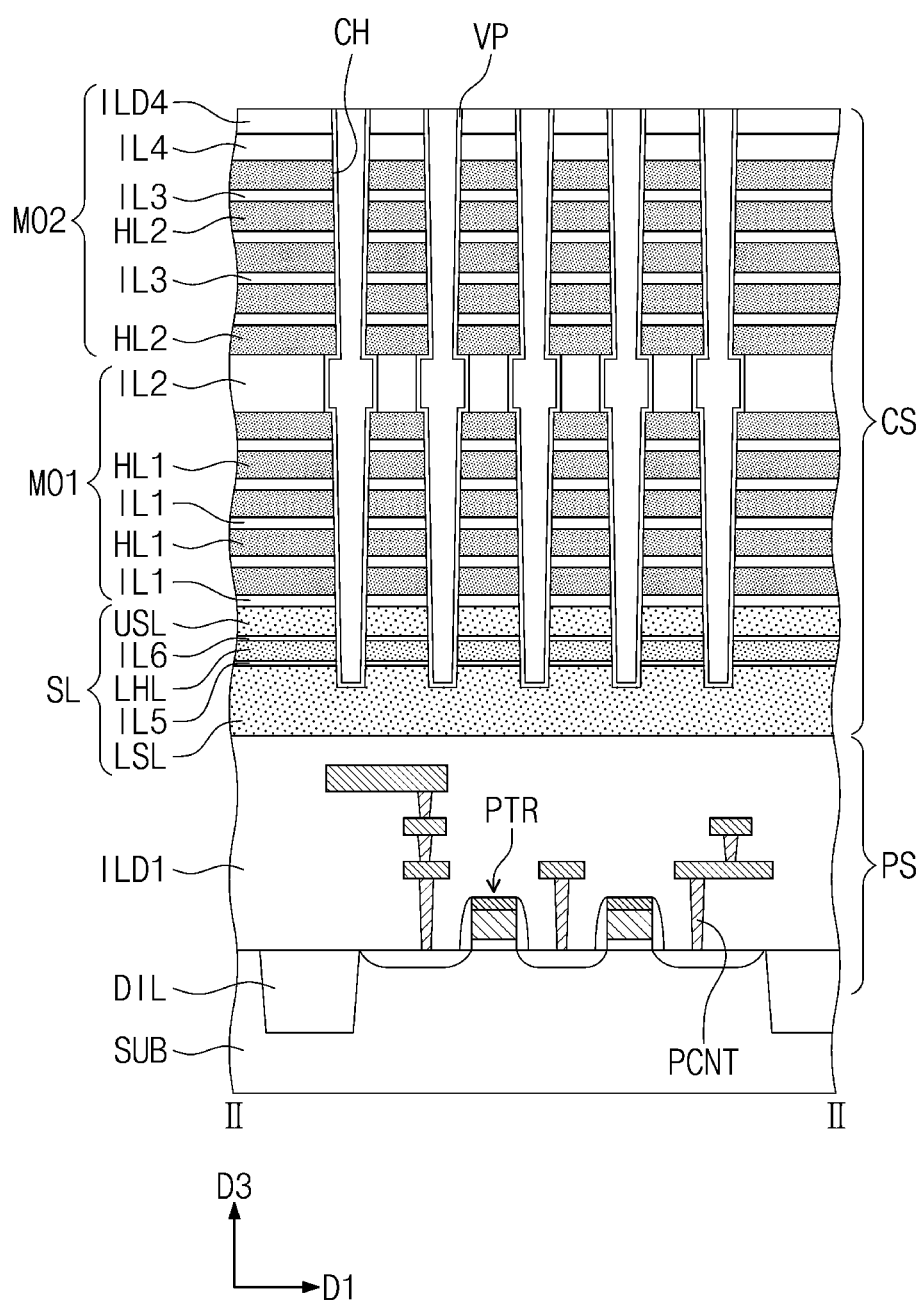

Referring to FIGS. 5, 14A, and 14B, the first and second sacrificial pillars HFI1 and HFI2 may be selectively removed from the first and second channel holes CH1 and CH2, respectively. When the first and second sacrificial pillars HFI1 and HFI2 are removed, the first and second dummy pillars DFI1 and DFI2 may be removed from the first and second channel holes CH1 and CH2, respectively. One empty first channel hole CH1 and one empty second channel hole CH2 may be spatially connected to each other to form a single channel hole CH. One empty first dummy hole DH1 and one empty second dummy hole DH2 may be spatially connected to each other to form a single dummy hole DH A vertical dielectric pattern VP may be formed on an inner wall of the channel hole CH. A slit dielectric layer SI together with a vertical dielectric pattern VP may be formed on an inner wall of the dummy hole DH. The vertical dielectric pattern VP and the slit dielectric layer SI may be conformally formed. The formation of the vertical dielectric pattern VP and the slit dielectric layer SI may include performing a physical vapor deposition (PVD) process or a chemical vapor deposition (CVD) process. For example, the physical vapor deposition process may be implemented with a thermal evaporation method or an E-beam evaporation method.

The physical vapor deposition may accomplish low step coverage. When the slit dielectric layer SI is formed, the slit dielectric layers SI on opposite inner walls of the dummy hole DH may meet each other to form a slit layer SLL. The slit layer SLL may induce the formation of a void SV in the dummy hole DH. The void SV may be an inner space of the slit SLT, which inner space is at least partially surrounded by the slit dielectric layer SI. After the formation of the slit layer SLL and the void SV, the fourth interlayer dielectric layer ILD4 may undergo a planarization process performed until top surfaces of the channel hole CH and the slit layer SLL are exposed.

Figure 15A:
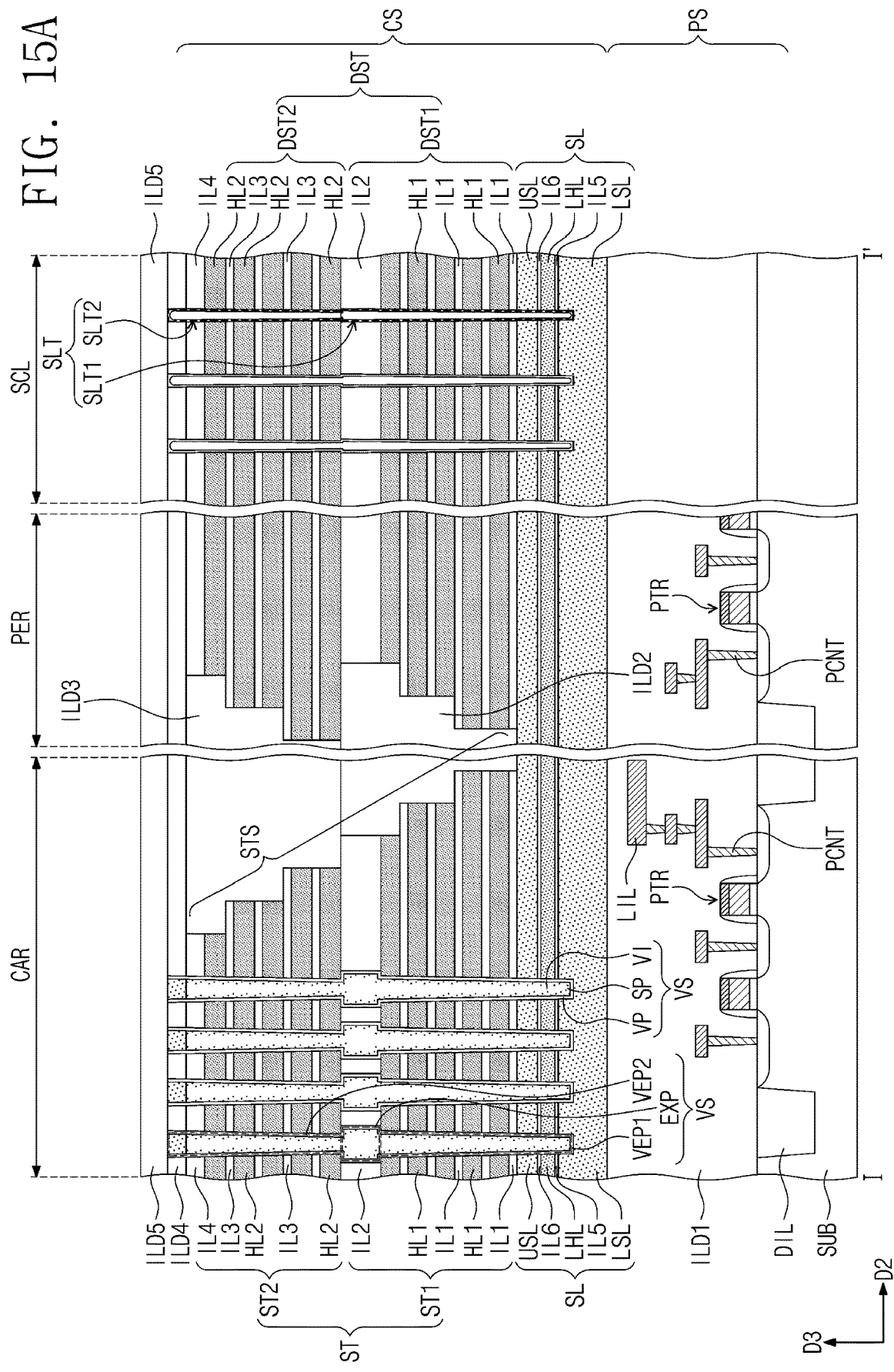
Figure 15B:
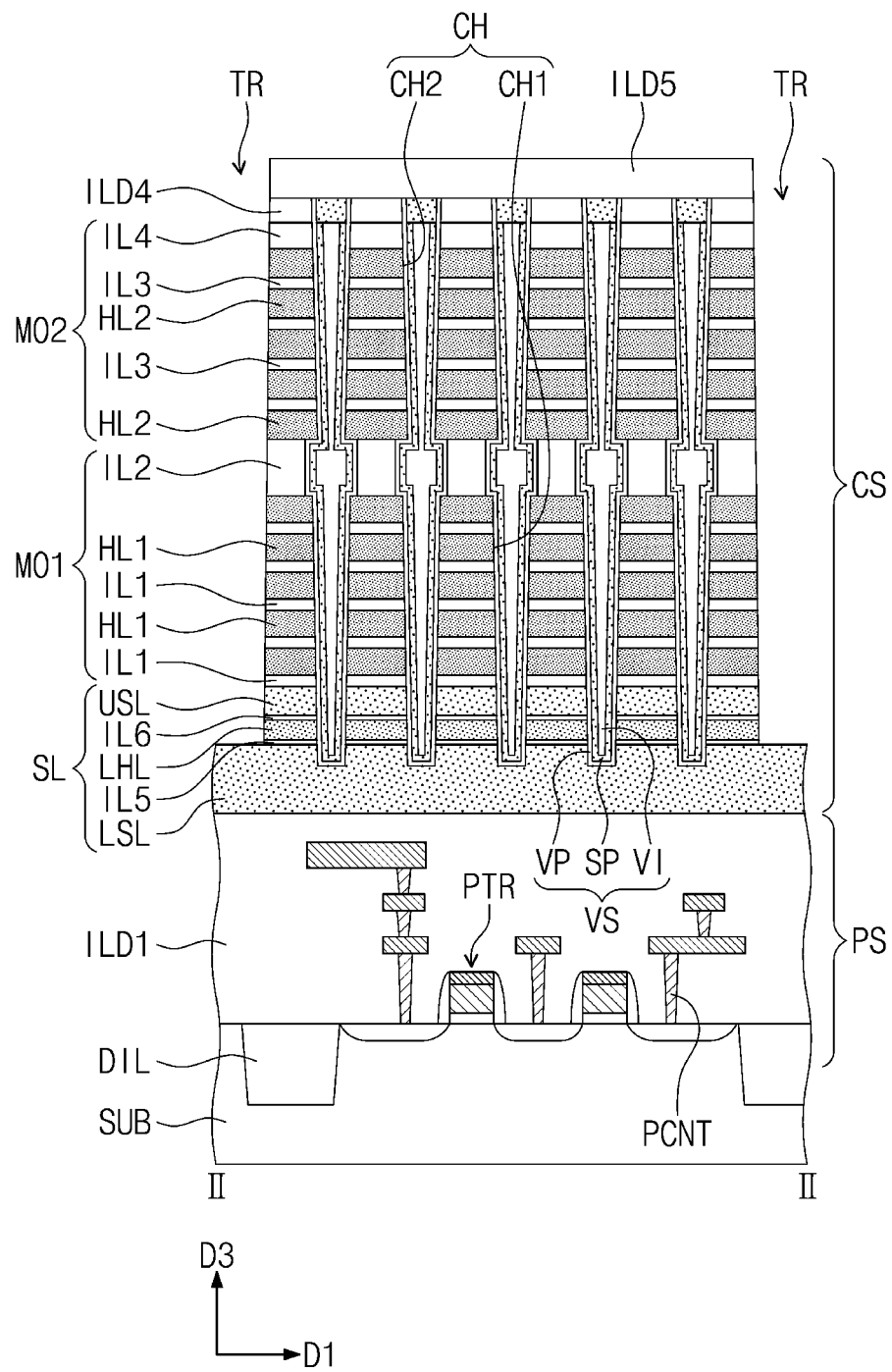

Referring to FIGS. 5, 15A, and 15B, vertical channel structures VS may be correspondingly formed in the channel holes CH. The formation of the vertical channel structure VS may include sequentially forming a vertical dielectric pattern VP, a vertical semiconductor pattern SP, and a buried dielectric pattern VI on the inner wall of the channel hole CH. The vertical dielectric pattern VP and the vertical semiconductor pattern SP may be conformally formed. A conductive pad PAD may be formed on an upper portion of each of the vertical channel structures VS.

A fifth interlayer dielectric layer ILD5 may be formed on the fourth interlayer dielectric layer ILD4. On the cell array region CAR, the first and second mold structures MO1 and MO2 may be patterned to form trenches TR that penetrate therethrough (see FIG. 15B). The trench TR may expose the lower semiconductor layer LSL. The trench TR may expose sidewalls of the first and second sacrificial layers HL1 and HL2. The trench TR may expose a sidewall of the fifth dielectric layer IL5, a sidewall of the lower sacrificial layer LHL, and a sidewall of the sixth dielectric layer IL6.

Referring back to FIGS. 5, 6A, and 6B, a source semiconductor layer SSL may replace the lower sacrificial layer LHL that is exposed to the trenches TR on the cell array region CAR. For example, the lower sacrificial layer LHL exposed to the trenches TR may be selectively removed. The removal of the lower sacrificial layer LHL may expose a lower portion of the vertical dielectric pattern VP of each of the vertical channel structures VS.

The exposed lower portion of the vertical dielectric pattern VP may be selectively removed. Therefore, a lower portion of the vertical semiconductor pattern SP may be exposed. While the lower portion of the vertical dielectric pattern VP is removed, the fifth and sixth dielectric layers IL5 and IL6 may also be removed.

The source semiconductor layer SSL may be formed in a space where the fifth dielectric layer IL5, the lower sacrificial layer LHL, and the sixth dielectric layer IL6 were removed from. The source semiconductor layer SSL may directly contact the exposed lower portion of the vertical semiconductor pattern SP. The source semiconductor layer SSL may directly contact the lower semiconductor layer LSL that underlies the source semiconductor layer SSL. The source semiconductor layer SSL may directly contact the upper semiconductor layer USL that overlies the source semiconductor layer SSL. A second substrate SL may be constituted by the lower semiconductor layer LSL, the source semiconductor layer SSL, and the upper semiconductor layer USL.

On the cell array region CAR, the first and second sacrificial layers HL1 and HL2 exposed to the trenches TR may be replaced with first and second electrodes EL1 and EL2 to form a stack structure ST. For example, the first and second sacrificial layers HL1 and HL2 may be selectively removed which are exposed to the trenches TR. The first electrodes EL1 may be formed in spaces from which the first sacrificial layers HL1 are removed, and the second electrodes EL2 may be formed in spaces from which the second sacrificial layers HL2 are removed. A plurality of separation structures SPS may fill corresponding trenches TR.

A plurality of bit-line contact plugs BPLG may penetrate the fifth interlayer dielectric layer ILD5 and may be correspondingly coupled to the conductive pads PAD. A plurality of cell contact plugs CPLG may penetrate the second, third, fourth, and fifth interlayer dielectric layers ILD2, ILD3, ILD4, and ILD5 and may be correspondingly coupled to the first and second electrodes EL1 and EL2. On the fifth interlayer dielectric layer ILD5, bit lines BL may electrically connect with the bit-line contact plugs BPLG, and upper wiring lines UIL may electrically connect with the cell contact plugs CPLG.

Figure 16:
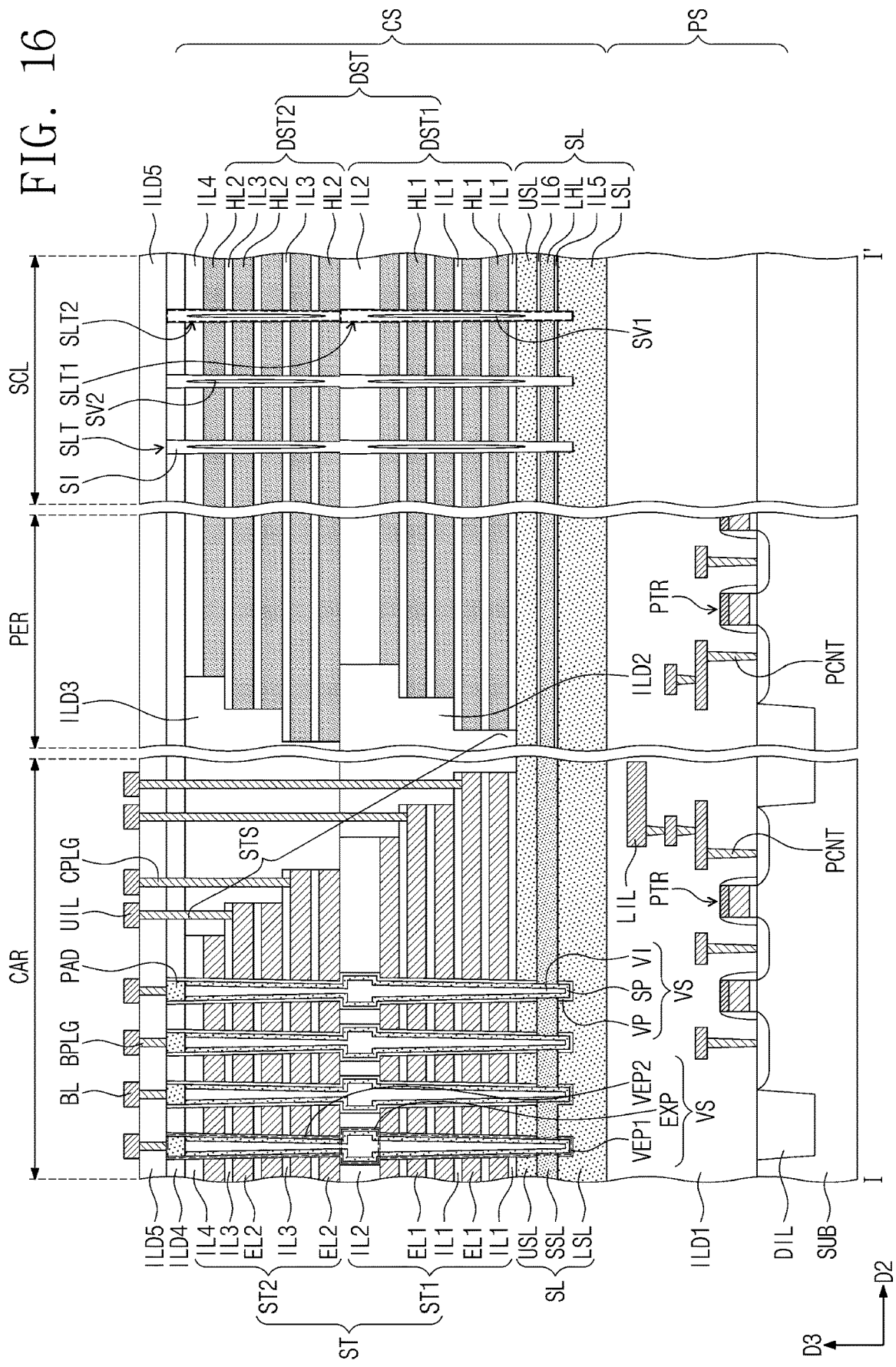
FIGS. 16, 17, and 18 are diagrams showing a semiconductor device according to some embodiments of the present inventive concepts.
Figure 17:
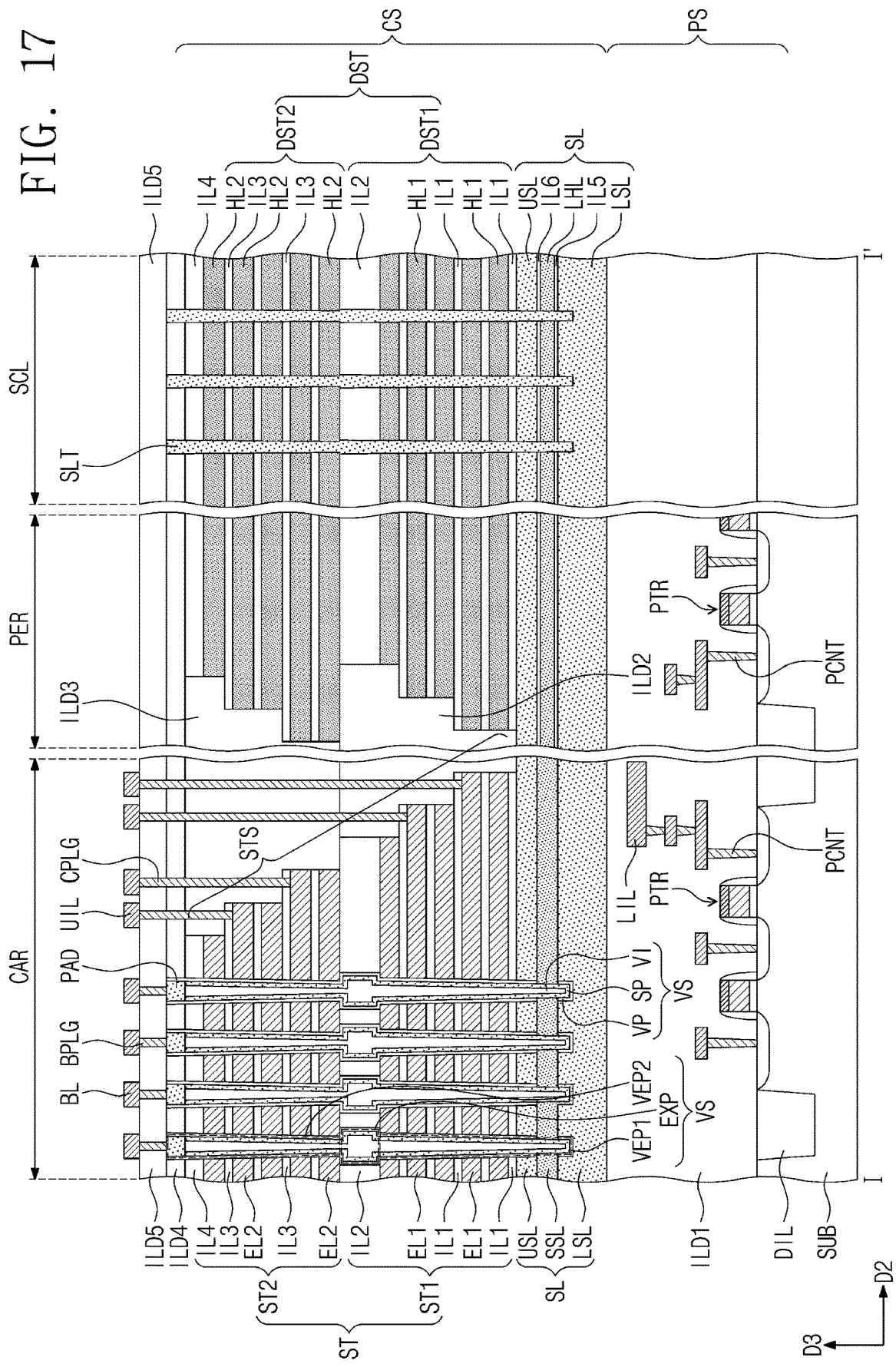
Figure 18:
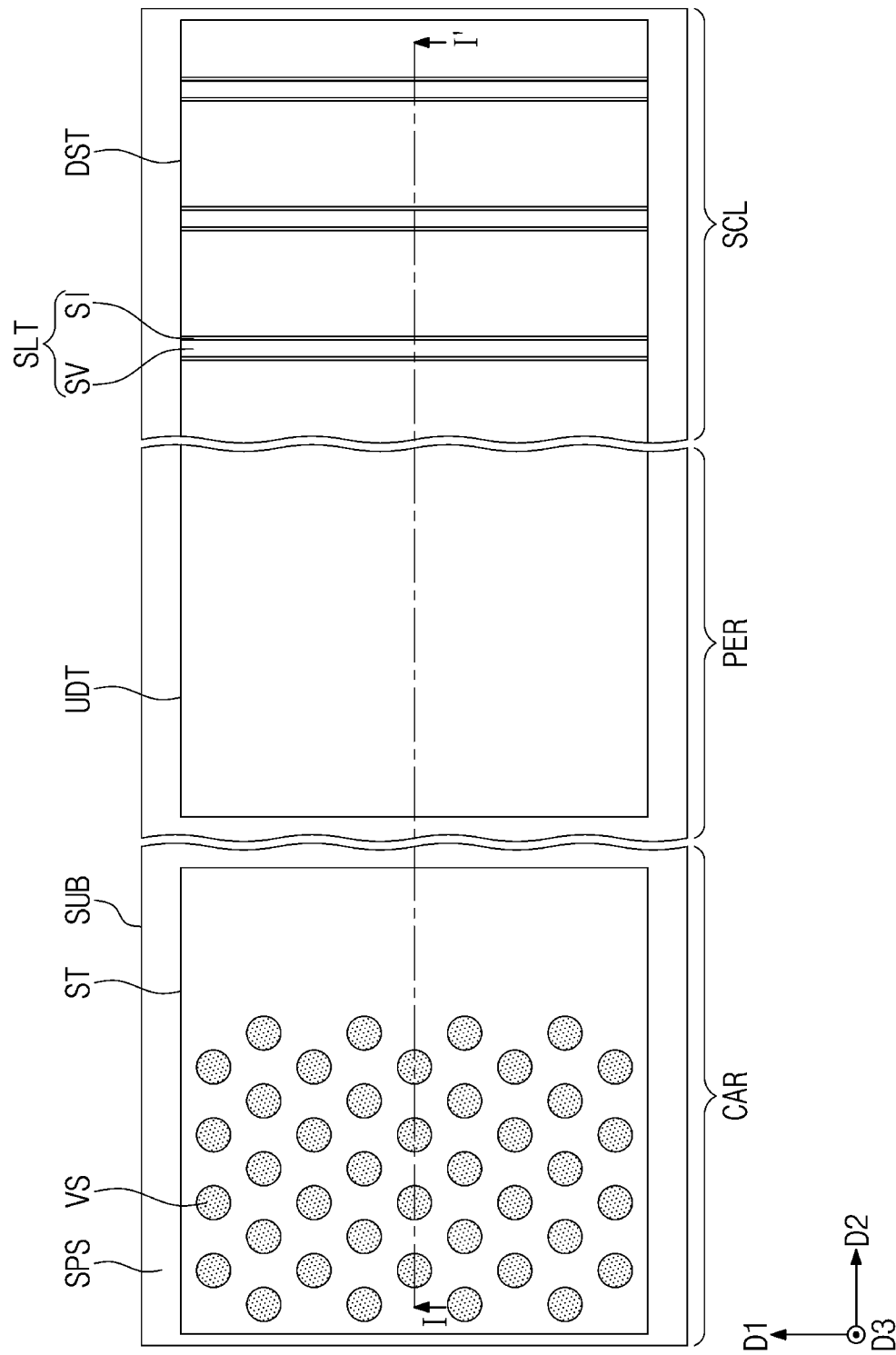

FIGS. 16, 17, and 18 are diagrams showing a semiconductor device according to some embodiments of the present inventive concepts. To the extent that elements shown in these figures are not descried herein in detail, it may be assumed that these elements are at least similar to corresponding elements described herein with respect to FIGS. 5, 6A, and 6B.

FIG. 16 shows an embodiment of a semiconductor device according to the present inventive concepts.

Referring to FIG. 16, a semiconductor device, according to embodiments of the present inventive concepts, may be configured such that each of the slits SLT on the scribe lane region SCL may include a first slit SLT1 and a second slit SLT2. The first slit SLT1 may include a first void SV1 therein. The second slit SLT2 may include a second void SV2 therein. The first void SV1 may partially penetrate the first dummy structure DST1. The second void SV2 may partially penetrate the second dummy structure DST2.

The slit dielectric layer SI may be provided between the first void SV1 and the second void SV2. For example, the slit dielectric layer SI may separate the first void SV1 and the second void SV2 from each other.

FIG. 17 shows an embodiment of a semiconductor device according to the present inventive concepts.

Referring to FIG. 17, a semiconductor device according to the present inventive concepts may be configured such that a void SV might not be provided in each of the slits SLT.

For example, each of the slits SLT may include the same material as that of the vertical dielectric pattern VP. For example, the formation of the slits SLT may be achieved simultaneously with the formation of the vertical dielectric pattern VP, and the slits SLT may thus be formed by a deposition process having high step coverage.

Alternatively, each of the slits SLT may include the same material as that of the first and second dummy pillars DFI1 and DFI2 of FIG. 13A. In this case, when the first and second sacrificial pillars HFI1 and HFI2 in a process that forms the channel hole CH of FIG. 14A, a mask may be selectively formed on the second dummy holes DH2 such that the first and second dummy pillars DFI1 and DFI2 may remain without being removed.

The same material may be uniformly distributed in each slit SLT, and a separation transition force may be induced in an extending direction of the slit SLT. For example, when a crack occurs in the dummy structure DST on the scribe lane region SCL, a crack may occur in the third direction D3 along the slit SLT. As a result, for the semiconductor device according to the present inventive concepts, the formation of crack in the second direction D2 may be prevented by the slits SLT that extend in the third direction D3 in the dummy structure DST on the scribe lane region SCL, and thus it may be possible to protect the cell array region CAR and the peripheral region PER.

FIG. 18 is a plan view showing an embodiment of a semiconductor device according to the present inventive concepts.

Referring to FIG. 18, each of the slits SLT may be shaped like a linear pattern. Each slit SLT may extend in the first direction D1 along the scribe lane region SCL. The slits SLT may be disposed spaced apart from each other in the second direction D2. A cross section taken along line I-I' of FIG. 18 may be substantially the same as the cross section of FIG. 6A.

Figure 19:
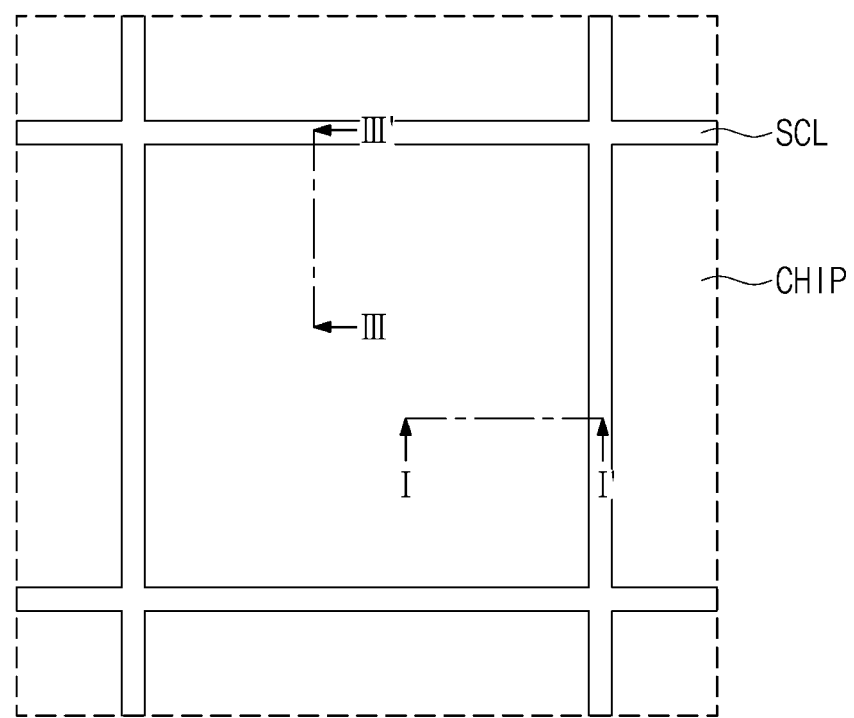
FIGS. 19 and 20 are diagrams showing a semiconductor device according to some embodiments of the present inventive concepts.
Figure 19:
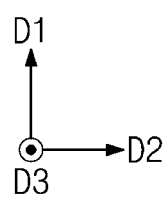
Figure 20:
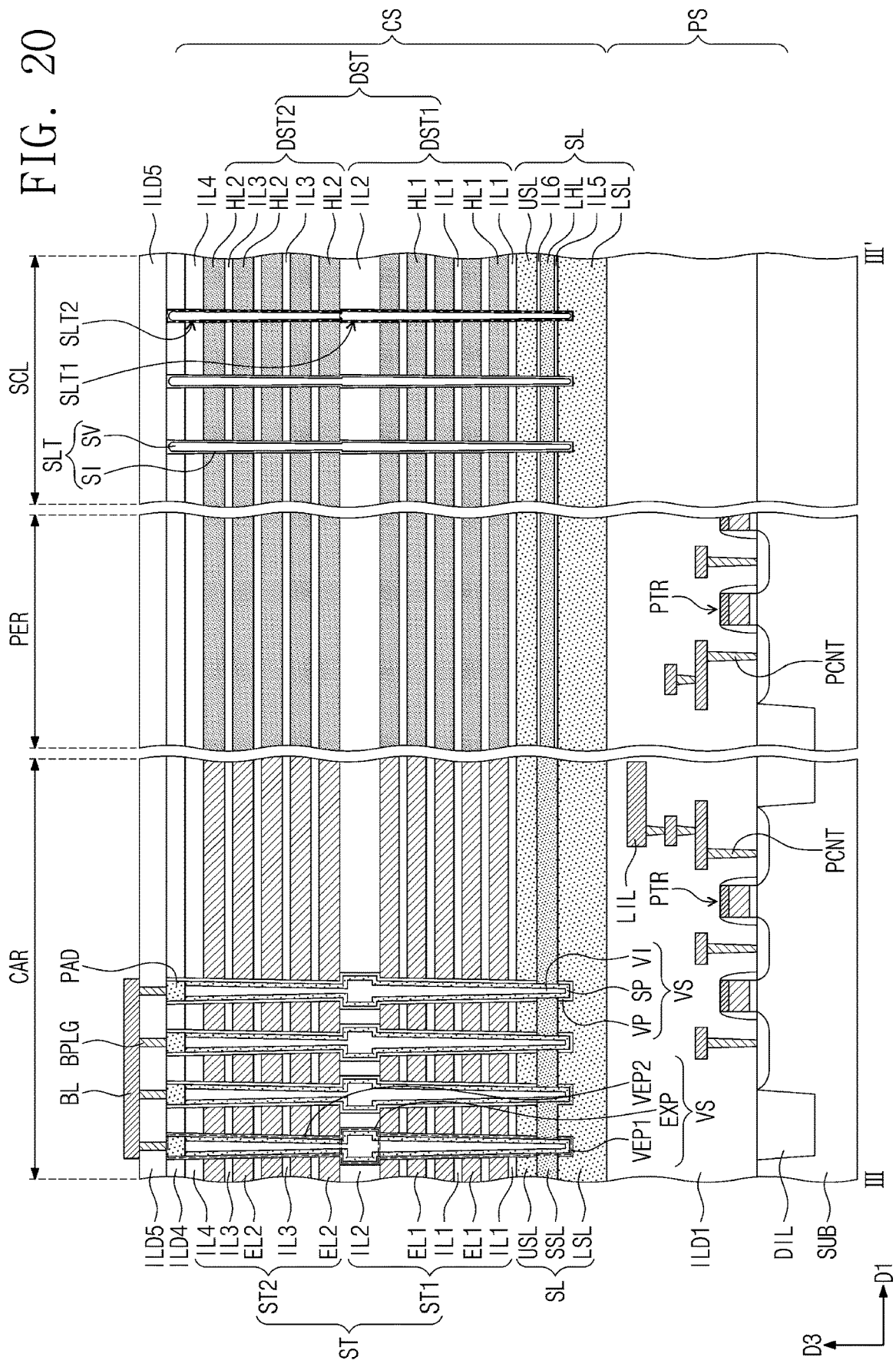

FIG. 19 is a plan view showing a substrate with integrated semiconductor devices according to some example embodiments of the present inventive concepts. FIG. 20 is a cross-sectional view taken along line of FIG. 19. A cross section taken along line I-I' of FIG. 20 may be substantially the same as the cross section of FIG. 6A taken along line I-I' of FIG. 5. To the extent that elements shown in FIGS. 19 and 20 are not described herein in detail, it may be assumed that these elements are at least similar to corresponding elements described herein with reference to FIGS. 5, 6A, and 6B.

Referring to FIGS. 19 and 20, a substrate SUB (e.g., wafer) may include chip regions CHIP on each of which a semiconductor chip is formed and a scribe lane region SCL between the chip regions CHIP. The scribe lane region SCL may be the same as the scribe lane region SCL of FIGS. 5 and 6A. The chip region CHIP may include the cell array region CAR and the peripheral region PER of FIGS. 5 and 6A. The chip regions CHIP may be two-dimensionally arranged on an entire surface of the substrate SUB, and each of the chip regions CHIP may be at least partially surrounded by the scribe lane region SCL. For example, the scribe lane region SCL may be disposed between the chip regions CHIP.

The first and second dummy structures DST1 and DST2 provided on the peripheral region PER may extend along the first direction D1 to the scribe lane region SCL. For example, the dummy structure DST on the scribe lane region SCL may be the first and second dummy structures DST1 and DST2 that extend in the first direction D1 on the peripheral region PER.

A stack structure ST on a cell array region CAR may include first electrodes and second electrodes. The first electrodes and second electrodes of the stack structure may be spaced apart from each other by first dielectric layers and second dielectric layers, respectively, and may be stacked alternately with each other in a third direction.

A dummy structure on a peripheral region and a scribe lane region may include first sacrificial layers and second sacrificial layers. The first sacrificial layers and second sacrificial layers of the dummy structure may be spaced apart from each other by the first dielectric layers and the second dielectric layers, respectively, and may be stacked alternately with each other in the third direction.

The first sacrificial layers and second sacrificial layers of the dummy structure may have their top surfaces coplanar with the top surfaces of the first electrodes and the second electrodes of the stack structure, respectively. The first sacrificial layers and second sacrificial layers of the dummy structure may have their bottom surfaces coplanar with the bottom surfaces of the first electrodes and the second electrodes of the stack structure, respectively.

The dummy structure provided on the peripheral region and the scribe lane region and the stack structure provided on the cell array region may share first dielectric layers, a second dielectric layer, third dielectric layers, and a fourth dielectric layer. For example, the first to fourth dielectric layers of the stack structure on the cell array region may each extend in a first direction to the peripheral region and the scribe lane region.

According to some embodiments of the present inventive concepts, slits may be provided in the dummy structure on the scribe lane region. Therefore, it may be possible to reduce the danger associated with a wave cut and a shift cut that occur in the procedure of a grinding after laser (GAL) process that convert a wafer level into a chip level, and thus to increase reliability and product yield of a semiconductor device.

Effects of the present inventive concepts are not necessarily limited to those mentioned above, other effects which have not been mentioned above will be clearly understood to those skilled in the art from the preceding description.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
 a substrate including a cell array region, a peripheral region, and a scribe lane region;
 a stack structure disposed on the cell array region of the substrate, the stack structure including a plurality of electrodes that are vertically stacked and spaced apart from each other;
 a dummy structure extending from the peripheral region to the scribe lane region of the substrate, the dummy structure including a plurality of first dielectric layers and a plurality of second dielectric layers that are alternately and repeatedly stacked, the plurality of first dielectric layers and the plurality of second dielectric layers being spaced apart from the stack structure in a horizontal direction that is perpendicular to the direction of the vertical stacking of the stack structure;
 a vertical channel structure penetrating the stack structure; and
 a slit disposed in the dummy structure on the scribe lane region,
 wherein the slit extends in a direction perpendicular to a top surface of the substrate and the slit penetrates at least a portion of the dummy structure, and
 wherein the slit includes a void.

2. The semiconductor device of claim 1, wherein the slit completely penetrates the dummy structure.

3. The semiconductor device of claim 1, wherein the slit further includes a slit dielectric layer.

4. The semiconductor device of claim 3, wherein
 the vertical channel structure includes a vertical dielectric pattern, and
 the slit dielectric layer includes a material that is the same as a material of the vertical dielectric pattern.

5. The semiconductor device of claim 1, wherein
 the dummy structure includes a first dummy structure and a second dummy structure disposed on the first dummy structure, and
 the slit includes a first slit disposed in the first dummy structure and a second slit disposed in the second dummy structure.

6. The semiconductor device of claim 5, wherein
 the first slit includes a first void, and
 the second slit includes a second void.

7. The semiconductor device of claim 5, wherein the first slit in the first dummy structure at least partially overlaps the second slit in the second dummy structure in a vertical direction.

8. The semiconductor device of claim 1, wherein
the slit is provided in plural, and
the plurality of slits is arranged on the scribe lane region and forms a slit array.

9. The semiconductor device of claim 1, wherein the slit has a linear pattern shape that extends on the scribe lane region.

10. The semiconductor device of claim 1, wherein the void is filled with air.

11. A semiconductor device, comprising:
a substrate including a cell array region, a peripheral region, and a scribe lane region;
a stack structure disposed on the cell array region of the substrate, the stack structure including a plurality of electrodes that are vertically stacked and spaced apart from each other;
a dummy structure extending from the peripheral region to the scribe lane region of the substrate, the dummy structure including a plurality of first dielectric layers and a plurality of second dielectric layers that are alternately and repeatedly stacked, the plurality of first dielectric layers and the plurality of second dielectric layers being spaced apart from the stack structure in a horizontal direction that is perpendicular to the direction of the vertical stacking of the stack structure;
a vertical channel structure penetrating the stack structure; and
a slit disposed in the dummy structure on the scribe lane region,
wherein the slit extends in a direction perpendicular to a top surface of the substrate and penetrates at least a portion of the dummy structure, and
wherein the slit includes a slit layer that at least partially covers a top surface of the slit.

12. The semiconductor device of claim 11, wherein
the vertical channel structure includes a vertical dielectric pattern, and
the slit layer includes a material that is the same as a material of the vertical dielectric pattern.

13. The semiconductor device of claim 11, wherein the slit layer is formed by a physical vapor deposition process.

14. The semiconductor device of claim 11, further comprising a slit dielectric layer that at least partially surrounds the slit.

15. The semiconductor device of claim 14, where the slit dielectric layer and the slit layer define a void in the slit.

16. The semiconductor device of claim 11, wherein the slit is formed substantially simultaneously with the vertical channel structure.

17. The semiconductor device of claim 11, wherein
the slit is provided in plural, and
the plurality of slits is arranged on the scribe lane region and forms a slit array.

18. An electronic system, comprising:
a three-dimensional semiconductor memory device; and
a controller electrically connected to the three-dimensional semiconductor memory device and configured to control the three-dimensional semiconductor memory device,
wherein the three-dimensional semiconductor memory device comprises:
a substrate that includes a cell array region, a peripheral region, and a scribe lane region;
a stack structure disposed on the cell array region of the substrate, the stack structure including a plurality of electrodes that are vertically stacked and spaced apart from each other;
a dummy structure that extends from the peripheral region to the scribe lane region of the substrate, the dummy structure including a plurality of first dielectric layers and a plurality of second dielectric layers that are alternately and repeatedly stacked, the plurality of first dielectric layers and the plurality of second dielectric layers being spaced apart from the stack structure in a horizontal direction that is perpendicular to the direction of the vertical stacking of the stack structure;
a vertical channel structure penetrating the stack structure; and
a slit disposed in the dummy structure on the scribe lane region,
wherein the slit extends in a direction perpendicular to a top surface of the substrate and penetrates at least a portion of the dummy structure, and
wherein the slit includes a void.

19. The electronic system of claim 18, wherein
the stack structure has a stepwise structure, and
each of a plurality of cell contact plugs is coupled to a corresponding electrode constituting the stepwise structure of the stack structure.

20. The electronic system of claim 19, wherein the cell contact plugs are formed substantially simultaneously with the slit.

* * * * *